US011158529B2

United States Patent
Yamaguchi et al.

(10) Patent No.: US 11,158,529 B2
(45) Date of Patent: Oct. 26, 2021

(54) METHOD OF MANUFACTURING SEMICONDUCTOR DEVICE, METHOD OF CONTROLLING TEMPERATURE AND NON-TRANSITORY COMPUTER-READABLE RECORDING MEDIUM

(71) Applicant: KOKUSAI ELECTRIC CORPORATION, Tokyo (JP)

(72) Inventors: Hideto Yamaguchi, Toyama (JP); Masashi Sugishita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 120 days.

(21) Appl. No.: 16/283,418

(22) Filed: Feb. 22, 2019

(65) Prior Publication Data

US 2019/0267267 A1    Aug. 29, 2019

(30) Foreign Application Priority Data

Feb. 23, 2018 (JP) ............................. JP2018-030515

(51) Int. Cl.
   *G05B 13/02*      (2006.01)
   *H01L 21/67*      (2006.01)
   (Continued)

(52) U.S. Cl.
   CPC .... *H01L 21/67248* (2013.01); *F27B 17/0025* (2013.01); *H01L 21/67109* (2013.01); *H01L 22/12* (2013.01); *F27D 2019/0028* (2013.01)

(58) Field of Classification Search
   None
   See application file for complete search history.

(56) References Cited

U.S. PATENT DOCUMENTS

2002/0014483 A1*  2/2002  Suzuki ............. H01L 21/67248
                                                          219/486
2002/0045146 A1*  4/2002  Wang ..................... C30B 31/18
                                                           432/49

(Continued)

FOREIGN PATENT DOCUMENTS

JP       2000-183072 A      6/2000
JP       2001-075605 A      3/2001
(Continued)

OTHER PUBLICATIONS

Japanese Office Action dated Jul. 14, 2020 for Japanese Patent Application No. 2018-030515.

*Primary Examiner* — Ali Naraghi
(74) *Attorney, Agent, or Firm* — Volpe Koenig

(57) ABSTRACT

There is provided a technique that includes (a) acquiring temperature data of at least one of a heater temperature defined by a temperature of a heater and a furnace temperature defined by an inner temperature of a process chamber, and acquiring a power supply value indicating an electric power supplied to the heater; (b) acquiring a reference temperature of the temperature data; (c) creating a predetermined equation using a prediction model of estimating a predicted temperature of the temperature data; (d) calculating a solution of minimizing a deviation between the reference temperature and the predicted temperature based on the predetermined equation; and (e) outputting a calculated power supply value calculated from the solution, and processing a substrate while controlling heating of the heater based on the calculated power supply value.

15 Claims, 14 Drawing Sheets

(51) Int. Cl.
*H01L 21/66* (2006.01)
*F27B 17/00* (2006.01)
*F27D 19/00* (2006.01)

(56) References Cited

U.S. PATENT DOCUMENTS

| | | | |
|---|---|---|---|
| 2002/0074324 A1 | 6/2002 | Wang et al. | |
| 2007/0059011 A1* | 3/2007 | Seo | G03G 15/2039 399/69 |
| 2013/0204416 A1 | 8/2013 | Takahashi et al. | |

FOREIGN PATENT DOCUMENTS

| | | |
|---|---|---|
| JP | 2001-344002 A | 12/2001 |
| JP | 2002-025997 A | 1/2002 |
| JP | 2002-091574 A | 3/2002 |
| JP | 2002-110552 A | 4/2002 |
| JP | 2013-161857 A | 8/2013 |

* cited by examiner

FIG. 4A

| REFERENCE TEMPERATURE | POWER SUPPLY AMOUNT | | | | |
|---|---|---|---|---|---|
| | ZONE A | ZONE B | ZONE C | ZONE D | ZONE E |
| 101 °C | 11% | 21% | 31% | 41% | 51% |

FIG. 4B

| REFERENCE TEMPERATURE | POWER SUPPLY AMOUNT | | | | |
|---|---|---|---|---|---|
| | ZONE A | ZONE B | ZONE C | ZONE D | ZONE E |
| 111 °C | 11% | 21% | 31% | 41% | 51% |

FIG. 4C

| REFERENCE TEMPERATURE | POWER SUPPLY AMOUNT | | | | |
|---|---|---|---|---|---|
| | ZONE A | ZONE B | ZONE C | ZONE D | ZONE E |
| 202 °C | 12% | 22% | 32% | 42% | 52% |

FIG. 4D

| REFERENCE TEMPERATURE | POWER SUPPLY AMOUNT | | | | |
|---|---|---|---|---|---|
| | ZONE A | ZONE B | ZONE C | ZONE D | ZONE E |
| 212 °C | 12% | 22% | 32% | 42% | 52% |

FIG. 5

| REFERENCE TEMPERATURE OF HEATER TEMPERATURE | | | | | REFERENCE TEMPERATURE OF FURNACE TEMPERATURE | | | | | POWER SUPPLY AMOUNT | | | | |
|---|---|---|---|---|---|---|---|---|---|---|---|---|---|---|
| ZONE A | ZONE B | ZONE C | ZONE D | ZONE E | ZONE A | ZONE B | ZONE C | ZONE D | ZONE E | ZONE A | ZONE B | ZONE C | ZONE D | ZONE E |
| 100 °C | 110 °C | 120 °C | 130 °C | 140 °C | 200 °C | 210 °C | 220 °C | 230 °C | 240 °C | 10 % | 20 % | 30 % | 40 % | 50 % |

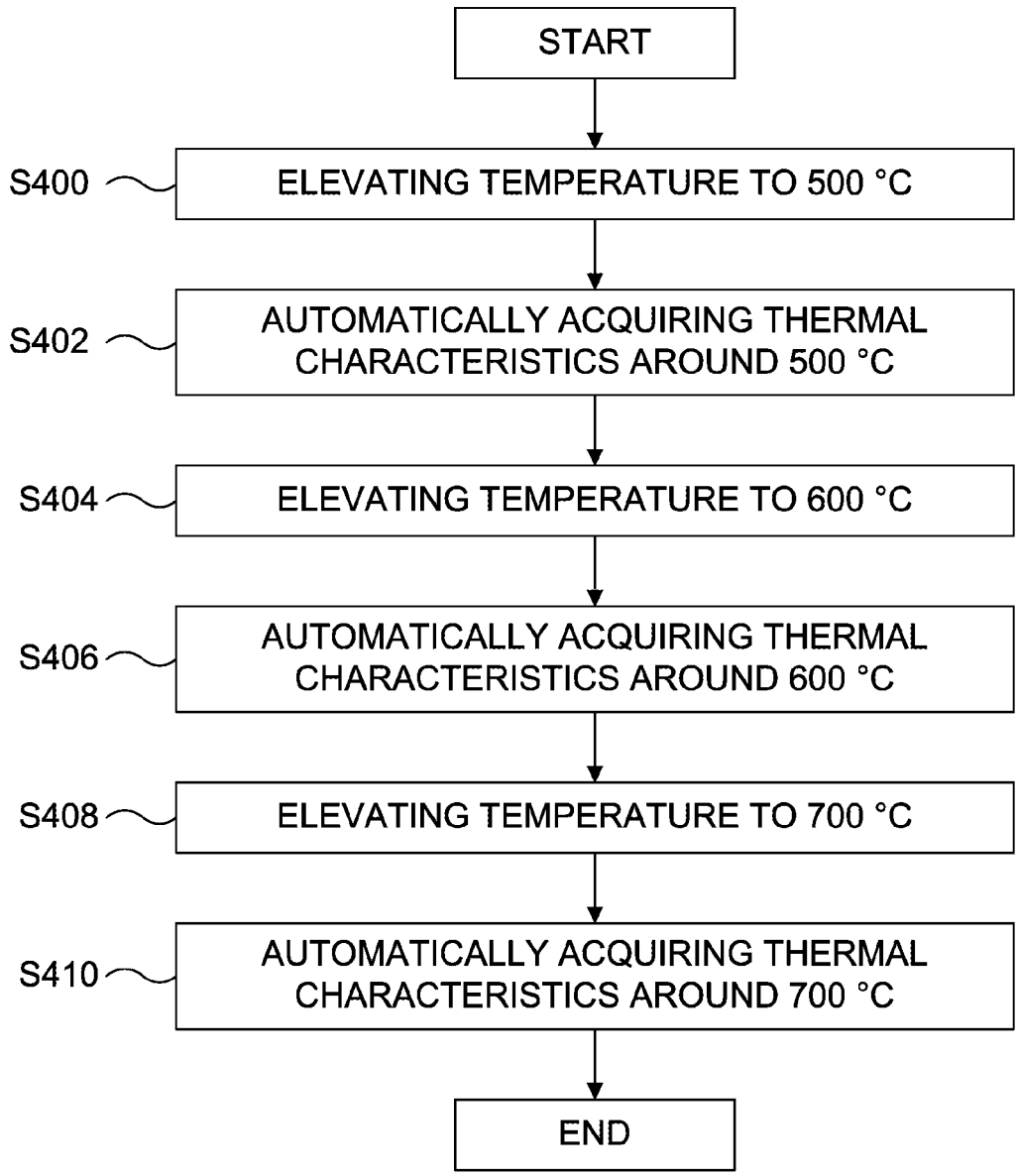

METHOD OF MANUFACTURING SEMICONDUCTOR DEVICE, METHOD OF CONTROLLING TEMPERATURE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2018-030515, filed on Feb. 23, 2018, the entire contents of which are hereby incorporated by reference.

BACKGROUND

1. Field

The present disclosure relates to a method of manufacturing a semiconductor device, a method of controlling a temperature and a non-transitory computer-readable recording medium.

2. Description of the Related Art

For example, in order to form a film on a substrate to be processed, the substrate is accommodated in a furnace of a semiconductor manufacturing apparatus and an inside of the furnace is heated. In addition, in order to maintain an inner temperature of the furnace at an appropriate temperature or to follow the inner temperature of the furnace according to a predetermined temperature change, a control device such as a controller of the semiconductor manufacturing apparatus performs a temperature control based on a temperature set in advance.

For example, according to a related art, a semiconductor manufacturing apparatus including a switching device is disclosed. The switching device is configured to switch between an operation amount output by a pattern generation part and an operation amount output by an adjustment part to which a target value and a control detection value are input via an adder, and is further configured to output the switched operation amount. In addition, according to another related art, a heat treatment apparatus including a sequencer is disclosed. The sequencer is configured to output a plurality of controller selection signals and a plurality of setting values for controlling a heat treatment furnace of the heat treatment apparatus in which an object (substrate) to be processed is processed by heat. In addition, according to still another related art, a semiconductor manufacturing apparatus capable of limiting an operation amount of a heater by preventing excessive integration.

As described above, the temperature control that is commonly used may be performed by controlling an amount of power of the heater capable of heating the inside of the furnace by feedback control based on a proportional, integral and derivative (hereinafter, simply referred to as a "PID") calculation so that the inner temperature of the furnace approaches a desired temperature. It is required to set in advance an appropriate proportional parameter, an integral parameter and a derivative parameter (hereinafter, simply referred to as a "PID parameter") in the feedback control based on the PID calculation. It is preferable that the PID parameter is set to an optimal value in advance according to the temperature characteristics of the heater.

However, in order to obtain the optimal value in the current situation, the PID parameter must be optimized by trial and error. In addition, the results of the optimization are often dependent on the intuition and experience of an engineer in charge. Therefore, the optimal PID parameter cannot be set when the temperature characteristics of the heater vary greatly or when the engineer in charge cannot have sufficient time.

SUMMARY

Described herein is a technique capable of maintaining a performance of controlling an inner temperature of a furnace at a high level while controlling heating of a heater with an optimal parameter.

According to embodiments of the present disclosure, in order to optimize a power supply value output to the heater, there is provided a technique including: (a) acquiring temperature data of at least one of a heater temperature defined by a temperature of a heater and a furnace temperature defined by an inner temperature of a process chamber, and acquiring a power supply value indicating an electric power supplied to the heater; (b) acquiring a reference temperature of the temperature data; (c) creating a predetermined equation using a prediction model of estimating a predicted temperature of the temperature data; (d) calculating a solution of minimizing a deviation between the reference temperature and the predicted temperature based on the predetermined equation; and (e) outputting a calculated power supply value calculated from the solution, and processing a substrate while controlling heating of the heater based on the calculated power supply value.

BRIEF DESCRIPTION OF THE DRAWINGS

FIGS. 4A through 4D illustrate examples of data stored in a prediction model memory area shown in FIG. 3.

FIG. 5 illustrates another example of data stored in the prediction model memory area shown in FIG. 3.

FIG. 14 is a flowchart illustrating a second example of the automatic acquisition procedure of the thermal characteristics of the temperature controller preferably used in the embodiments described herein.

DETAILED DESCRIPTION

Embodiments

Hereinafter, one or more embodiments according to the technique will be described.

First Embodiment

Figure 1:
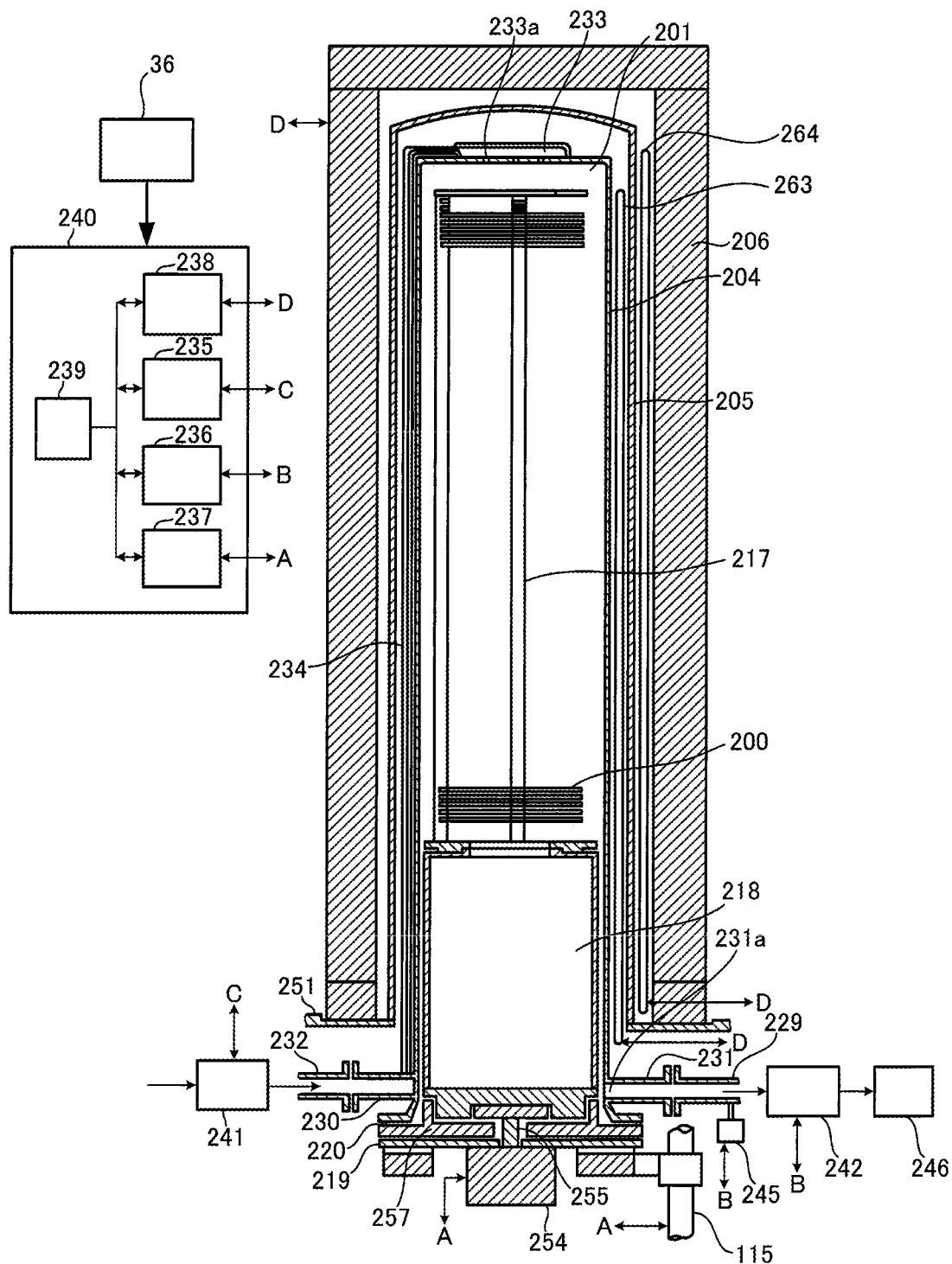
FIG. 1 schematically illustrates a vertical cross-section of a process furnace of a substrate processing apparatus preferably used in one or more embodiments described herein.

FIG. 1 schematically illustrates a vertical cross-section of a process furnace 202 of a substrate processing apparatus preferably used for manufacturing a semiconductor device in one or more embodiments including the first embodiment described herein.

As shown in FIG. 1, the process furnace 202 includes a heater 206 serving as a heating apparatus (heating mechanism). The heater 206 is cylindrical, and is vertically installed while being supported by a heater base 251 serving as a support plate.

A soaking tube (also referred to as an "outer tube") 205 is provided on an inner side of the heater 206 so as to be concentric with the heater 206. For example, the soaking tube 205 is made of a heat resistant material such as silicon carbide (SiC), and is cylindrical with a closed upper end and an open lower end. A reaction tube (also referred to as an "inner tube") 204 is provided on an inner side of the soaking tube 205 so as to be concentric with the soaking tube 205. The reaction tube 204 is made of a heat resistant material such as quartz (SiO$_2$), and is cylindrical with a closed upper end and an open lower end. A process chamber 201 is provided in a hollow cylindrical portion of the reaction tube 204. The process chamber 201 is configured to accommodate vertically arranged wafers including a wafer 200 serving as a substrate in a horizontal orientation in a multistage manner by a boat 217 described later.

A gas introduction part 230 is provided at a lower end portion of the reaction tube 204. A thin pipe 234 serving as a gas introduction pipe is disposed along an outer wall of the reaction tube 204 from the gas introduction part 230 to a ceiling portion 233 of the reaction tube 204. A gas supplied through the gas introduction part 230 flows upward in the thin pipe 234 to the ceiling portion 233, and then is supplied into the process chamber 201 through a plurality of gas introduction ports 233a provided in the ceiling portion 233. A gas exhaust part 231 configured to exhaust an inner atmosphere of the reaction tube 204 through an exhaust port 231a is provided at the lower end portion of the reaction tube 204 at locations different from locations where the gas introduction part 230 is provided.

A gas supply pipe 232 is connected to the gas introduction part 230. A process gas supply source (not shown), a carrier gas supply source (not shown) and an inert gas supply source (not shown) are connected to the gas supply pipe 232 opposite to the gas introduction part 230 via an MFC (mass flow controller) 241 serving as a gas flow rate controller on the upstream side of the gas supply pipe 232. When it is necessary to supply water vapor into the process chamber 201, a water vapor generating apparatus (not shown) is provided at the gas supply pipe 232 at the downstream of the MFC 241. A gas flow rate controller 235 is electrically connected to the MFC 241, and is configured to control the MFC 241 such that the flow rate of the gas supplied into the process chamber 201 becomes a desired flow rate at a desired timing.

A gas exhaust pipe 229 is connected to the gas exhaust part 231. An exhaust device 246 is connected to the gas exhaust pipe 229 opposite to the gas exhaust part 231 via a pressure sensor 245 serving as a pressure detector and a pressure adjusting device 242. The exhaust device 246 is configured to exhaust the process chamber 201 such that an inner pressure of the process chamber 201 is at a desired pressure. A pressure controller 236 is electrically connected to the pressure sensor 245 and the pressure adjusting device 242. The pressure controller 236 is configured to control the pressure adjusting device 242 based on the pressure detected by the pressure sensor 245 such that the inner pressure of the process chamber 201 is at a predetermined pressure at a desired timing.

A base 257 serving as a holding body capable of airtightly closing a lower end opening of the reaction tube 204 and a seal cap 219 serving as a furnace opening cover are provided at the lower end portion of the reaction tube 204. The seal cap 219 is made of metal such as stainless steel, and is disk-shaped. The base 257 is made of a material such as quartz, and is disk-shaped. The base 257 is provided on the seal cap 219. An O-ring 220 serving as a sealing part is provided on an upper surface of the base 257, and is in contact with the lower end of the reaction tube 204. A rotating mechanism 254 configured to rotate the boat 217 is provided at the seal cap 219 opposite to the process chamber 201. A rotating shaft 255 of the rotating mechanism 254 is connected to the boat 217 and a heat insulating cylinder 218 through the seal cap 219 and the base 257. As the rotating mechanism 254 rotates the boat 217 and the heat insulating cylinder 218, the wafers including the wafer 200 are rotated. The seal cap 219 may be elevated or lowered by a boat elevator 115 serving as an elevating mechanism vertically provided outside the reaction tube 204. When the seal cap 219 is elevated or lowered by the boat elevator 115, the boat 217 may be loaded into the process chamber 201 or unloaded out of the process chamber 201. An operation controller 237 is electrically connected to the rotating mechanism 254 and the boat elevator 115. The operation controller 237 is configured to control the rotating mechanism 254 and the boat elevator 115 such that the rotating mechanism 254 and the boat elevator 115 perform desired operations at a desired timing.

The boat 217 serving as a substrate retainer is made of a heat resistant material such as quartz and silicon carbide. The boat 217 is configured to support the wafers including the wafer 200 while the wafers are horizontally oriented with their centers aligned with each other. The heat insulating cylinder 218 serving as a heat insulating part is provided under the boat 217 so as to support the boat 217. The heat insulating cylinder 218 is made of a heat resistant material such as quartz and silicon carbide, and is cylindrical. The heat insulating cylinder 218 is configured to suppress the transmission of the heat from the heater 206 to the lower end of the reaction tube 204.

Two types of sensors serving as temperature detectors are provided in the process furnace 202. That is, a first temperature sensor 263 serving as the temperature detector is provided between the reaction tube 204 and the soaking tube 205, and a second temperature sensor 264 serving as the temperature detector is provided between the soaking tube 205 and the heater 206. Each of the first temperature sensor 263 and the second temperature sensor 264 uses a plurality of thermocouples to detect the temperature. The first temperature sensor 263 and the second temperature sensor 264 will be described later in detail. A temperature controller 238 is electrically connected to the heater 206, the first temperature sensor 263 and the second temperature sensor 264.

A main controller 240 is constituted by the gas flow rate controller 235, the pressure controller 236, the operation controller 237, the temperature controller 238 and an operation part 239. The operation part 239 includes an input/output part (not shown) and a display part (not shown), and is configured to exchange data with the gas flow rate controller 235, the pressure controller 236, the operation controller 237 and the temperature controller 238. A host controller 36 is connected to the main controller 240. The host controller 36 may include components such as an input/output part (not shown) similar to the operation part 239. The main controller 240 may be controlled based on the host controller 36.

Hereinafter, a method of performing a process such as an oxidation process and a diffusion process to the wafer 200, which are part of manufacturing processes of a semiconductor device, will be described. The process is performed by using the above-described process furnace 202. Hereinafter, the components of the substrate processing apparatus are controlled by the main controller 240.

<Preparation Step>

First, the wafers including the wafer 200 are transferred (charged) into the boat 217 (wafer charging).

<Boat Loading Step>

Subsequently, as shown in FIG. 1, the boat 217 charged with the wafers including the wafer 200 is elevated by the boat elevator 115 and loaded into the process chamber 201. With the boat 217 loaded, the seal cap 219 seals the lower end of the reaction tube 204 via the base 257 and the κ-ring 220. In the boat loading step, the heater 206 is controlled to heat an inside of the process chamber 201 until an inner temperature of the process chamber 201 reaches a desired temperature, for example, 600° C. In addition, the exhaust device 246 exhausts the inside of the process chamber 201 until the inner pressure of the process chamber 201 reaches a desired pressure. While the exhaust device 246 exhausts the inside of the process chamber 201, the pressure adjusting device 242 is feedback-controlled based on the pressure detected by the pressure sensor 245.

<Temperature Elevating Step>

Then, the inside of the process chamber 201 is heated until the inner temperature of the process chamber 201 reaches a film-forming temperature, for example, 800° C. For example, the inside of the process chamber 201 is heated at a rate of 50° C./min. In the temperature elevating step, the state of electrical conduction to the heater 206 is feedback-controlled based on temperature values (temperature information) detected by the first temperature sensor 263 and the second temperature sensor 264 such that the inner temperature of the process chamber 201 has a desired temperature distribution. The control of the heater 206 based on the temperature information detected by the first temperature sensor 263 and the second temperature sensor 264 will be described later in detail. Subsequently, the rotation mechanism 254 rotates the heat insulating cylinder 218 and the boat 217, whereby the wafers including the wafer 200 are rotated.

<Film-Forming Step>

After the inner temperature of the process chamber 201 reaches the film-forming temperature of 800° C. through the temperature elevating step, then the gas such as a process gas and a carrier gas are supplied through a gas supply source such as the process gas supply source and the carrier gas supply source, and the flow rate of the gas is adjusted by the MFC 241 to a desired flow rate. The gas having the flow rate thereof adjusted is then supplied through the gas supply pipe 232 and the gas introduction part 230, and flows upward in the thin pipe 234 to the ceiling portion 233. Then, the gas is supplied into the process chamber 201 through the plurality of gas introduction ports 233a for showering the gas. When the wafer 200 is processed using the water vapor, the gas having the flow rate thereof adjusted by the MFC 241 to a desired flow rate is supplied to the water vapor generating apparatus. Then, the gas containing the water vapor ($H_2O$) generated by the water vapor generating apparatus is supplied into the process chamber 201. The gas supplied into the process chamber 201 flows downward in the process chamber 201, and then is exhausted through the exhaust port 231a and the gas exhaust part 231. While the gas passes through the process chamber 201, the gas contacts a surface of the wafer 200. As a result, the process such as the oxidation process or the diffusion process is performed to the wafer 200.

<Temperature Lowering Step>

After a processing time set in advance has elapsed, the inner temperature of the process chamber 201 is lowered at a desired temperature, for example, 600° C. For example, the inner temperature of the process chamber 201 is lowered at a rate of 20° C./min. In the temperature lowering step, an inert gas is supplied into the process chamber 201 from the inert gas supply source. Thereby, an inner atmosphere of the process chamber 201 is replaced with the inert gas and the inner pressure of the process chamber 201 is returned to atmospheric pressure.

<Boat Unloading Step>

Thereafter, the seal cap 209 is lowered by the boat elevator 115 and the lower end of the reaction tube 204 is opened. The boat 217 with the processed wafers including the wafer 200 charged therein is unloaded out of the reaction tube 204 through the lower end of the reaction tube 204. Then, the processed wafers including the wafer 200 are transferred (discharged) from the boat 217 (wafer discharging).

Hereinafter, the control of the heater 206 by the temperature controller 238 according to one or more embodiments will be described in detail. Preferably, the temperature controller 238 preferably used in one or more embodiments may be applied to the boat loading step through the film-forming step described above. The temperature controller 238 may be applied to the boat loading step through the temperature lowering step described above.

Figure 2:
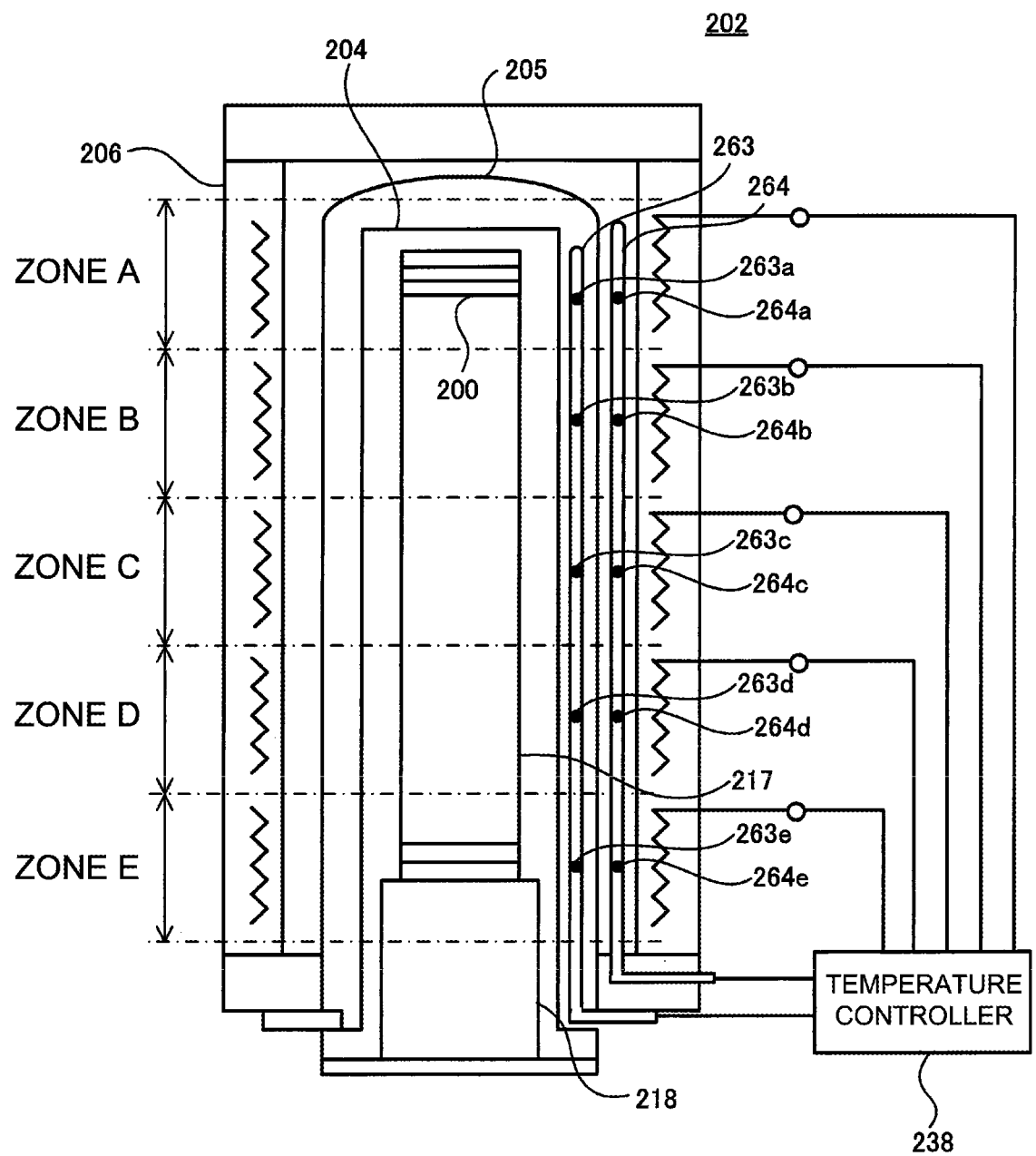
FIG. 2 schematically illustrates an exemplary configuration in which a temperature of a heater is adjusted by a temperature controller preferably used embodiments described herein.

FIG. 2 schematically illustrates an exemplary configuration in which the temperature of the heater 206 is adjusted by the temperature controller 238 using the first temperature sensor 263 and the second temperature sensor 264.

According to the exemplary configuration shown in FIG. 2, the heater 206 is divided into five zones in the vertical direction, that is, "ZONE A", "ZONE B", "ZONE C", "ZONE D" and "ZONE E" from the top to the bottom of the heater 206.

The first temperature sensor 263 detects the temperature between the reaction tube 204 and the soaking tube 205. In the first temperature sensor 263, thermocouples 263a, 263b, 263c, 263d and 263e serving as cascade thermocouples are installed corresponding to each zone described above.

The second temperature sensor 264 detects the temperature between the soaking tube 205 and the heater 206. In the second temperature sensor 264, thermocouples 264a, 264b, 264c, 264d and 264e serving as heater thermocouples are installed corresponding to each zone described above.

That is, the temperature controller 238 is configured to adjust the state of electrical conduction to each zone of the heater 206 based on the temperature information detected by the thermocouples 263a through 263e and the thermocouples 264a through 264e such that the inner temperature of the process chamber 201 reaches a processing temperature set in advance by the host controller 36 at a desired timing.

In the following description, the temperature detected by the second temperature sensor 264 (that is, the thermocouples 264a through 264e) is also referred to as a "heater temperature", and the temperature detected by the first temperature sensor 263 (that is, the thermocouples 263a through 263e) is also referred to as a "furnace temperature".

Figure 3:
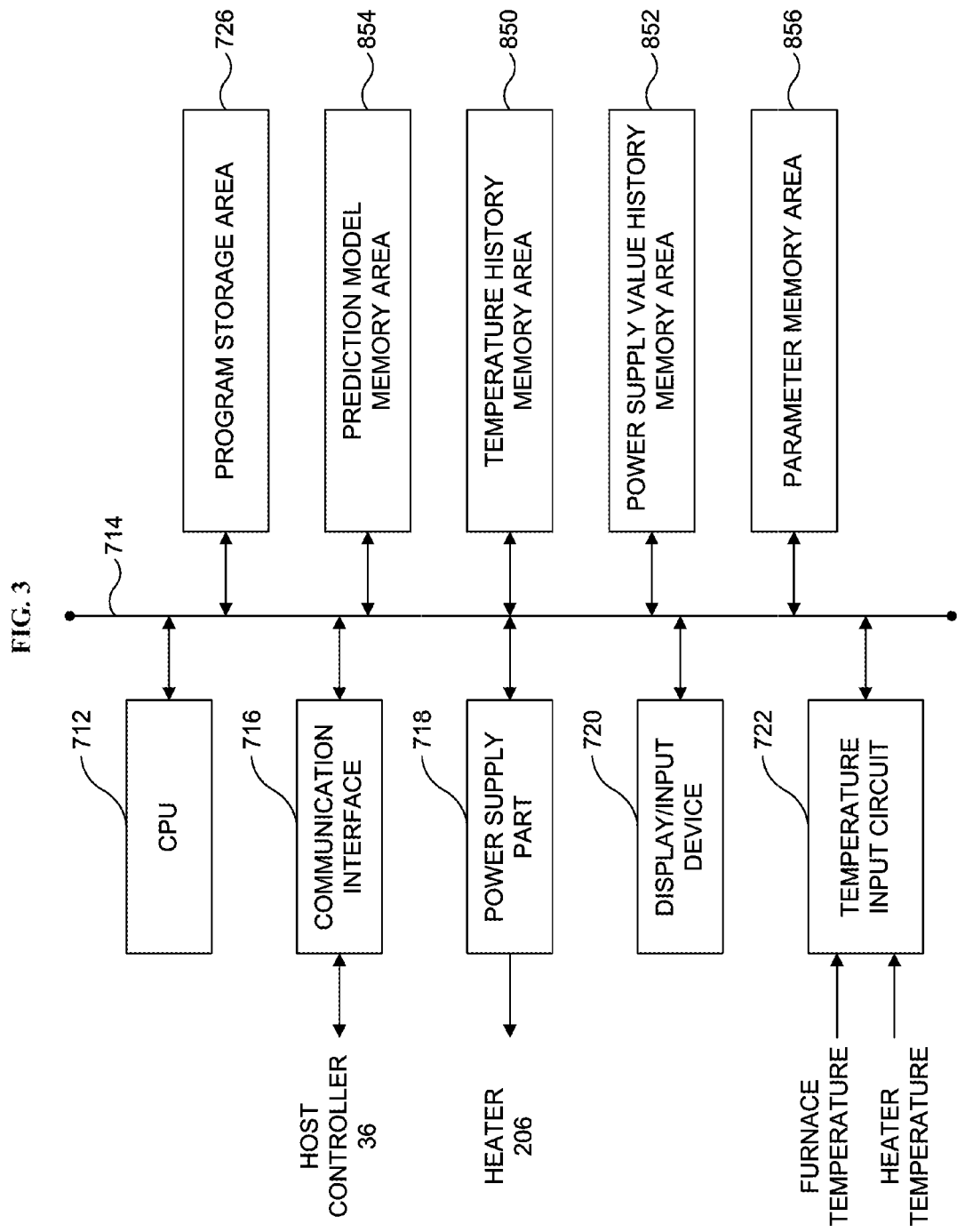
FIG. 3 is a block diagram illustrating a configuration of the temperature controller preferably used in the embodiments.

FIG. 3 is a block diagram illustrating a configuration of the temperature controller 238.

As shown in FIG. 3, the temperature controller 238 includes components such as a CPU 712, a communication interface (IF) 716, a power supply part 718, a display/input device 720 and a temperature input circuit 722. The components of the temperature controller 238 are connected to each other via a control bus 714. A memory or a memory device serving as a memory part is connected to the control bus 714. The memory device may include areas such as a program storage area 726, a prediction model memory area 854, a temperature history memory area 850, a power supply value history memory area 852 and a parameter memory area 856.

In the temperature history memory area 850, a history of temperature data (heater temperature information) of the heater temperature which is the temperature of the heater 206 detected by the second temperature sensor 264 via the temperature input circuit 722 is stored for a certain period. In addition, a history of temperature data (furnace temperature information) of the furnace temperature which is the inner temperature of the process chamber 201 detected by the first temperature sensor 263 via the temperature input circuit 722 is stored for a certain period.

In the power supply value history memory area 852, a history (power supply value information) of the power supply value (0% through 100%) to the heater 206 is stored only for a certain period.

In the prediction model memory area 854, a prediction model of estimating a predicted temperature of at least one of the heater temperature and the furnace temperature is stored for each of temperature ranges. Specifically, coefficients related to the prediction model, a coefficient error correlation matrix described later, a reference temperature and a steady state power value are stored. The coefficients related to the prediction model, the coefficient error correlation matrix, the reference temperature and the steady state power value are stored for each of the heater temperature and the furnace temperature of each zone. In addition, the prediction model related to the heater temperature in every zone of the heater is paired with the prediction model of the furnace temperature in every zone of the heater to be stored as a pair for each temperature range. As such, the prediction model memory area 854 stores a plurality of such pairs respectively corresponding to the temperature ranges. Thus, the prediction model is configured to cope with a plurality of temperature ranges.

In the present specification, the reference temperature refers to a temperature when the heater temperature and the furnace temperature are in a steady state. The steady state power value refers to a reference value of the prediction model, and may be a power supply value for each zone when the heater temperature and the furnace temperature are in the steady state at the reference temperature.

For example, in the prediction model memory area 854, the data related to the prediction model is stored in a table format as shown in FIGS. 4A, 4B, 4C, 4D and 5.

FIG. 4A illustrates a reference value related to the prediction model of the heater temperature of "ZONE A". Specifically, FIG. 4A illustrates a reference temperature of 101° C. and a power supply amount for each zone when the heater temperature of "ZONE A" is in the steady state at the reference temperature of 101° C. FIG. 4B illustrates a reference value related to the prediction model of the heater temperature of "ZONE B". Specifically, FIG. 4B illustrates a reference temperature of 111° C. and a power supply amount for each zone when the heater temperature of "ZONE B" is in the steady state at the reference temperature of 111° C. Tables similar to those shown in FIGS. 4A and 4B are prepared and stored for reference values related to the prediction models of the heater temperature of "ZONE C", "ZONE D" and "ZONE E", respectively.

FIG. 4C illustrates a reference value related to the prediction model of the furnace temperature of "ZONE A". Specifically, FIG. 4C illustrates a reference temperature of 202° C. and a power supply amount for each zone when the furnace temperature of "ZONE A" is in the steady state at the reference temperature of 202° C. FIG. 4D illustrates a reference value related to the prediction model of the furnace temperature of "ZONE B". Specifically, FIG. 4D illustrates a reference temperature of 212° C. and a power supply amount for each zone when the furnace temperature of "ZONE B" is in the steady state at the reference temperature of 212° C. Tables similar to those shown in FIGS. 4C and 4D are prepared and stored for reference values related to the prediction models of the furnace temperature of "ZONE C", "ZONE D" and "ZONE E", respectively.

FIG. 5 illustrates another example of the data stored in the prediction model memory area. Referring to FIG. 5, the heater temperature is 100° C. and the furnace temperature is 200° C. in "ZONE A", the heater temperature is 110° C. and the furnace temperature is 210° C. in "ZONE B", the heater temperature is 120° C. and the furnace temperature is 220° C. in "ZONE C", the heater temperature is 130° C. and the furnace temperature is 230° C. in "ZONE D" and the heater temperature is 140° C. and the furnace temperature is 240° C. in "ZONE E" when the power supply amount for each zone is maintained as described below and the steady state is reached after sufficient time has elapsed. Specifically, the power supply amount of "ZONE A" is 10%, the power supply amount of "ZONE B" is 20%, the power supply amount of "ZONE C" is 30%, the power supply amount of "ZONE D" is 40% and the power supply amount of "ZONE E" is 50%. In the example shown in FIG. 5, it is necessary to adjust the power supply value according to the steady state. However, the memory area can be made smaller as compared with those shown in FIGS. 4A through 4D.

Various parameters for realizing the prediction model are stored in the parameter memory area 856.

In the program storage area 726, a temperature control program is stored. The temperature control program is configured to select the prediction model in a predetermined temperature range, to input the temperature data and to control the components such as the heater 206 such that the predicted temperature becomes optimal.

The CPU 712 executes a predetermined processing based on the temperature control program stored in the memory or the program storage area 726 in the memory device. The CPU 712 is configured to communicate with the host controller 36 via the communication IF 716 and acquire a target temperature. In addition, the CPU 712 is configured to detect the furnace temperature and the heater temperature, output a control signal to the power supply part 718 via the temperature input circuit 722, and control the amount of electric power supplied to the "ZONE A" through "ZONE E" of the heater 206, respectively.

That is, the temperature controller 238 controls the heater 206 by acquiring data such as the history of the temperature data, the history of the power supply value and the various parameters from the temperature history memory area 850, the power supply value history memory area 852 and the parameter memory area 856, respectively, and executing the temperature control program using the prediction model stored in the prediction model memory area 854. The embodiments including the first embodiment will be described by way of an example in which the temperature controller 238 executes the temperature control program at least including: (a) acquiring at least one of the heater temperature defined by the temperature of the heater 206 and the furnace temperature defined by the temperature of the process chamber 201, and acquiring the power supply value indicating the electric power supplied to the heater 206; (b) acquiring the reference temperature of the temperature data and the prediction model of estimating the predicted temperature of the temperature data from the prediction model memory area 854; (c) calculating the power supply value such that a deviation between the reference temperature and the predicted temperature is minimized using the prediction model; and (d) outputting the calculated power supply value and controlling the heater 206 based on the calculated power supply value. In addition, according to the embodiments, the temperature control program may further include: (e) creating a characteristics equation using the prediction model and calculating a solution of the characteristics equation.

The display/input device 720 is configured to display and input the data such as the various parameters stored in the parameter memory area 856.

<Prediction Model>

Hereinafter, the prediction model stored in the prediction model memory area 854 will be described. In the present specification, the prediction model refers to an equation (that is, formula. Hereinafter, "equation" is referred to as "formula") for calculating the predicted temperature. For example, the following Formula 1 is used as the prediction model.

$$\Delta y(t) = a_1 \cdot y(t-1) + a_2 \cdot y(t-2) + ma_1 \cdot p_a(t-1) + ma_2 \cdot p_a(t-2) + \ldots + ma_n \cdot p_a(t-n)$$

$$+ mb_1 \cdot p_b(t-1) + mb_2 \cdot p_b(t-2) + \ldots + mb_n \cdot p_b(t-n)$$

$$+ mc_1 \cdot p_c(t-1) + mc_2 \cdot p_c(t-2) + \ldots + mc_n \cdot p_c(t-n)$$

$$+ md_1 \cdot p_d(t-1) + md_2 \cdot p_d(t-2) + \ldots + md_n \cdot p_d(t-n)$$

$$+ me_1 \cdot p_e(t-1) + me_2 \cdot p_e(t-2) + \ldots + me_n \cdot p_e(t-n) + bi \quad \text{[Formula 1]}$$

In the Formula 1, the symbol $\Delta y(t)$ indicates a deviation of the predicted temperature from the reference temperature at time t, and the symbols $y(t-1)$ and $y(t-2)$ indicates deviations from the reference temperature of the temperature one time before [that is, at time (t−1)] and two times before [that is, at time (t−2)]. In addition, the symbols $p_a(t-1)$, $p_a(t-2)$ through $p_a(t-n)$ indicate deviations from the steady state power value of the power supply values of "ZONE A" one time before, two times before through n times before [that is, at time (t−n)], the symbols $p_b(t-1)$, $p_b(t-2)$ through $p_b(t-n)$ indicate deviations from the steady state power value of the power supply values of "ZONE B" one time before, two times before through n times before, the symbols $p_c(t-1)$, $p_c(t-2)$ through $p_c(t-n)$ indicate deviations from the steady state power value of the power supply values of "ZONE C" one time before, two times before through n times before, the symbols $p_d(t-1)$, $p_d(t-2)$ through $p_d(t-n)$ indicate deviations from the steady state power value of the power supply values of "ZONE D" one time before, two times before through n times before, and the symbols $p_e(t-1)$, $p_e(t-2)$ through $p_e(t-n)$ indicate deviations from the steady state power value of the power supply values of "ZONE E" one time before, two times before through n times before.

In the Formula 1, the symbols $a_1$, $a_2$, $ma_1$ through $ma_n$, $mb_1$ through $mb_n$, $mc_1$ through $mc_n$, $md_1$ through $md_n$, $me_1$ through $me_n$ are coefficients corresponding to the respective deviations described above, the symbol bi is a constant term, and the symbol n is a value set in advance in the parameter memory area 856.

In the Formula 1, since $\Delta y(t)$ is the deviation from the reference temperature of the predicted temperature at time t, the final predicted temperature is obtained by adding the $\Delta y(t)$ and the reference temperature. However, $\Delta y(t)$ itself may be simply described as the predicted temperature in the following description in some cases.

The prediction model is stored for each of the heater temperature and the furnace temperature for each zone, and can be used for control computation. Specifically, for example, the prediction model related to the predicted temperature of the furnace temperature of "ZONE A" and the prediction model related to the predicted temperature of the heater temperature of "ZONE E" may be stored. In addition, the temperature shown in the Formula 1 described above may be the heater temperature or the furnace temperature.

The reference temperature and the steady state power value are acquired at a preliminary stage of preparing the prediction model in an automatic acquisition procedure of thermal characteristics. The constant term bi is an adjustment term when the reference temperature or the steady state power value acquired in advance is deviated from the actual value. When the pre-acquired reference temperature and the pre-acquired steady state power value are invariant with the lapse of time, the constant term of the prediction model shown in the Formula 1 acquired after the automatic acquisition procedure of the thermal characteristics, that is, the constant term hi is expected to be zero (0) (that is, bi=0). However, since the reference temperature and the steady state power value change from moment to moment due to the conditions such as the change of surrounding environment, the fluctuations of the power and the noise of the thermocouples, the constant term bi is included in the prediction model shown in the Formula 1.

In addition, it is assumed that the reference temperature and the steady state power value are different in value depending on the temperature range, and are nonlinear. When the reference temperature and the steady state power value are inaccurate, the accuracy of the predicted temperature decreases and the control performance is influenced.

Therefore, preferably, the reference temperature and the steady state power value are acquired at a temperature close to the predetermined processing temperature described above of the process such as the oxidation process and the diffusion process described above.

When the temperature is maintained at the reference temperature and the power supply amount is maintained at the steady state power value, according to the Formula 1, y(t−1), y(t−2) are zero and $p_a(t-1)$ through $p_a(t-n)$, $p_b(t-1)$ through $p_b(t-n)$, $p_c(t-1)$ through $p_c(t-n)$, $p_d(t-1)$ through $p_d(t-n)$ and $p_e(t-1)$ through $p_e(t-n)$ are all zero. As a result, Δy(t) is equal to hi (that is, Δy(t)=b), and the predicted temperature is obtained by adding the reference temperature and bi. When the reference temperature and the steady state power value are invariant and hi is zero (0) (that is, bi=0), the predicted temperature is the same as the reference temperature. That is, in the steady state at the reference temperature, it is shown that the prediction model of the Formula 1 is valid.

According to the Formula 1, for example, assuming that the Formula 1 indicates the prediction model related to the furnace temperature of "ZONE A", not only the power supply amount of "ZONE A" but also the power supply amounts of the other zones such as "ZONE B" and "ZONE C" affect the furnace temperature of "ZONE A" depending on the coefficients thereof. That is, the mutual thermal interference between the zones can be expressed depending on the coefficients thereof.

According to the prediction model shown in the Formula 1 described above, it is possible to predict the surrounding temperature for a pair of reference temperatures. Since it is assumed that increasing characteristics and decreasing characteristics of the temperature varies depending on the temperature range, the prediction models of a plurality of temperature ranges may be stored in the prediction model memory area 854, and the prediction model may be selected among the prediction models.

For the prediction model of the heater temperature, in order to simplify the calculation, the following Formula 2 may be used in some cases instead of the Formula 1.

$$\Delta y_h(t) = a_1 \cdot y_h(t-1) + a_2 \cdot y_h(t-2) + m_1 \cdot p(t-1) + m_2 \cdot p(t-2) + \ldots + m_n \cdot p(t-n) + bi \quad \text{[Formula 2]}$$

In the Formula 2, the symbol $\Delta y_h(t)$ indicates the deviation of the predicted temperature of the heater temperature from the reference temperature at time t, the symbols $y_h(t-1)$ and $y_h(t-^2)$ indicates the deviations of the heater temperature from the reference temperature of the temperature one time before [that is, at time (t−1)] and two times before [that is, at time (t−2)]. In addition, the symbols p(t−1), p(t−2) through p(t−n) indicate deviations of the power supply values of the corresponding zone one time before, two times before through n times before from the steady state power value, the symbols $a_1$, $a_2$, $m_1$, $m_2$ through $m_n$ are coefficients corresponding to the respective deviations described above, the symbol bi is a constant term, and the symbol n is a value set in advance in the parameter memory area 856.

That is, in the Formula 2 described above, only the power supply value of the corresponding zone acts on the predicted temperature of the heater temperature. Thermal interference from the other zones is not considered. For example, when calculating the predicted temperature of the heater temperature of "ZONE A", only the power supply value of "ZONE A" is used. As shown in FIG. 2, since the thermocouple 264*a* of the second temperature sensor 264 is installed in the vicinity of the heater 206, it is assumed that there is no heat effect from the heater 206 in the divided other zones such as "ZONE B" through "ZONE E" or the heat effect from the heater 206 in the divided other zones is negligibly small.

In addition, in the Formula 2, since the calculation amount of the product-sum calculation is reduced as compared with that in the Formula 1, the processing of calculating the predicted temperature becomes faster. Furthermore, since the number of coefficients of the prediction model to be obtained in the automatic acquisition procedure of the thermal characteristics described later decreases, the processing becomes faster.

Figure 6:
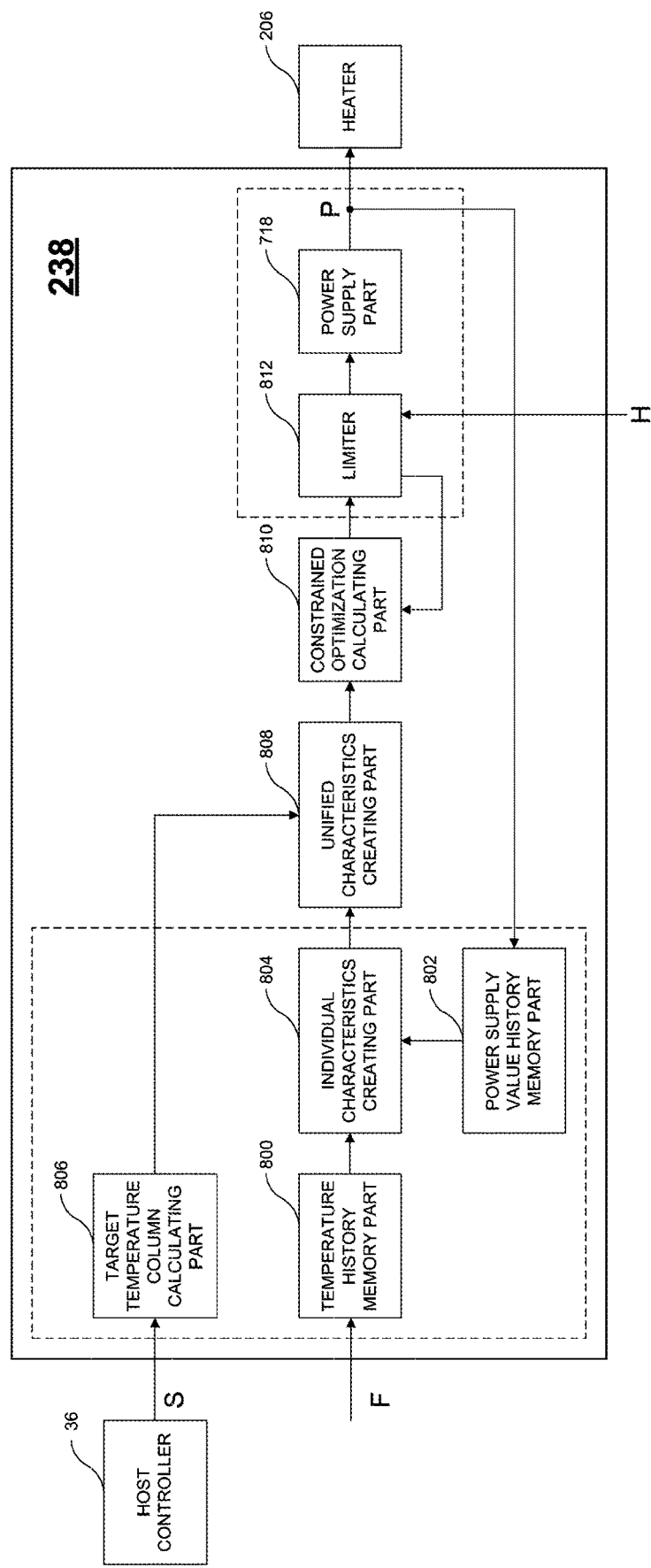
FIG. 6 is a block diagram illustrating a configuration of the temperature controller preferably used in a first embodiment described herein.

FIG. 6 is a block diagram illustrating a configuration of the temperature controller 238 shown in FIG. 3.

As shown in FIG. 6, the host controller 36 and the heater 206 are connected to the temperature controller 238, and the target temperature from the host controller 36 is input to an input terminal S. The furnace temperature from the first temperature sensor 263 is input to an input terminal F. The heater temperature from the second temperature sensor 264 is input to an input terminal H.

The target temperatures and input terminals S are present as many as the number of the thermocouples 263*a* through 263*e* of the first temperature sensor 263. However, since the input terminals S have the same configuration, only one of the input terminals S is shown in FIG. 6. Similarly, input terminals F are present as many as the number of the thermocouples 263*a* through 263*e* of the first temperature sensor 263. However, since the input terminals F have the same configuration, only one of the input terminals F is shown in FIG. 6. Similarly, input terminals H are present as many as the number of the thermocouples 264*a* through 264*e* of the second temperature sensor 264. However, since the input terminals H have the same configuration, only one of the input terminals H is shown in FIG. 6.

For example, the temperature controller 238 is constituted by a temperature history memory part 800, a power supply value history memory part 802, an individual characteristics creating part 804, a target temperature column calculating part 806, a unified characteristics creating part 808, a constrained optimization calculating part 810, a limiter 812 and a power supply part 718.

The furnace temperature from the first temperature sensor 263 is input to the temperature history memory part 800 via the input terminal F and the temperature history memory part 800 stores the furnace temperature in the temperature history memory area 850 for a certain period. Specifically, the temperature history memory part 800 writes furnace temperatures in the sequential order of acquiring them (i.e., from the furnace temperature initially acquired to the furnace temperature acquired at the time t) with predetermined time intervals therebetween into the temperature history memory area 850. When the temperature history memory area 850 is filled with data, the oldest data is discarded and new data is written where the oldest data is discarded. According to a manner described above, the data of the furnace temperatures from the current time (present time) to the past time are always stored for a certain period.

In order to unify the standard of the time, the furnace temperature written by the processing at the current time t according to a control algorithm is represented by y(t−1) (that is, the temperature one time before) shown in the Formula 1. The acquired furnace temperature is a temperature calculated from the average of the electromotive forces of the thermocouples 263*a* through 263*e* up to the time of writing.

The power supply value output via an output terminal P is input to the power supply value history memory part 802, and the power supply value history memory part 802 stores the data of the power supply value in the power supply value history memory area 852 for a certain period. Specifically, the power supply value history memory part 802 writes power supply values in the sequential order of acquiring them (i.e., from the power supply value initially acquired to the power supply value acquired at the time t) with predetermined intervals therebetween into the power supply value history memory area 852. When the power supply value history memory area 852 is filled with data, the oldest data is discarded and new data is written where the oldest data is discarded. According to a manner described above, the data of the power supply values from the current time (present time) to the past time is always stored for a certain period.

In order to unify the standard of the time, the power supply value written by the processing at the current time t according to the control algorithm is represented by $p_n(t-1)$, $p_b(t-1)$, $p_c(t-1)$, $p_d(t-1)$ and $p_e(t-1)$ (that is, the power supply values one time before) shown in the Formula 1. The power supply value written by the processing at the current time t is a power supply value calculated from the previous processing and continuously supplied until the current time t.

The individual characteristics creating part 804 acquires the prediction model of the furnace temperature of the zone from the prediction model memory area 854, acquires the current (that is, the time t) and past data of the furnace temperature from the temperature history memory area 850, acquires the current and past data of the power supply value from the power supply value history memory area 852, and calculates an individual input response characteristics matrix $S_{sr}$ and an individual zero response characteristics vector $S_{zr}$ which will be described below with reference to the Formula 3 and the Formula 4, respectively. The individual input response characteristics matrix $S_{sr}$ and the individual zero response characteristics vector $S_{zr}$ are calculated according to the number of furnace temperatures to be controlled (that is, the number of the zones).

The Formula 1 described above is represented by a state space model as shown in the following Formula 3.

$$\begin{cases} x(t+1) = A \cdot x(t) + B \cdot u(t) \\ y(t) = C \cdot x(t) \end{cases} \quad \text{[Formula 3]}$$

The matrices A, B and C shown in the Formula 3 are represented as below. In order to simplify the illustration, the deviations of the power supply values of "ZONE A" through "ZONE C" four times before (that is, n is four) from the steady state power value are used. In the following, for simplicity of the illustration, the deviations of "ZONE A" through "ZONE C" up to four times before are exemplified. However, the embodiments are not limited thereto.

$$A = \begin{bmatrix} a_1 & a_2 & ma_2 & ma_3 & ma_4 & mb_2 & mb_3 & mb_4 & mc_2 & mc_3 & mc_4 \\ 1 & 0 & 0 & 0 & 0 & 0 & 0 & 0 & 0 & 0 & 0 \\ 0 & 0 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 1 & 0 & 0 & 0 & 0 & 0 \\ 0 & 0 & 0 & 0 & 0 & 0 & 1 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & 0 & 0 & 1 & 0 & 0 \\ 0 & 0 & 0 & 0 & 0 & 0 & 0 & 0 & 0 & 1 & 0 \end{bmatrix}$$

$$B = \begin{bmatrix} ma_1 & mb_1 & mc_1 \\ 0 & 0 & 0 \\ 1 & 0 & 0 \\ 0 & 0 & 0 \\ 0 & 0 & 0 \\ 0 & 1 & 0 \\ 0 & 0 & 0 \\ 0 & 0 & 0 \\ 0 & 0 & 1 \\ 0 & 0 & 0 \\ 0 & 0 & 0 \end{bmatrix}$$

$$C = [1\ 0\ 0\ 0\ 0\ 0\ 0\ 0\ 0\ 0\ 0]$$

In addition, the vectors x(t), u(t) and the output y(t) are represented as below. In order to simplify the illustration, the deviations of the power supply values of "ZONE A" through "ZONE C" four times before (that is, n is four) from the steady state power value are used.

$$x(t) = \begin{bmatrix} y(t) \\ y(t-1) \\ p_a(t-1) \\ p_a(t-2) \\ p_a(t-3) \\ p_b(t-1) \\ p_b(t-2) \\ p_b(t-3) \\ p_c(t-1) \\ p_c(t-2) \\ p_c(t-3) \end{bmatrix}$$

$$u(t) = \begin{bmatrix} p_a(t) \\ p_b(t) \\ p_c(t) \end{bmatrix}$$

$$y(t) = \Delta y(t)$$

When the power supply value at the time t, that is, u(t) is input in the Formula 3, and then u(t) is continuously input as it is, the predicted temperature after time (t+1) is represented as shown in the following Formula 4.

$$\begin{bmatrix} \Delta y(t+1) \\ \Delta y(t+2) \\ \Delta y(t+3) \\ \vdots \end{bmatrix} = \begin{bmatrix} y(t+1) \\ y(t+2) \\ y(t+3) \\ \vdots \end{bmatrix} = \begin{bmatrix} C \cdot A^2 \\ C \cdot A^3 \\ C \cdot A^4 \\ \vdots \end{bmatrix} \cdot x(t-1) + \quad \text{[Formula 4]}$$

$$\begin{bmatrix} C \cdot A \cdot B \\ C \cdot A^2 \cdot B \\ C \cdot A^3 \cdot B \\ \vdots \end{bmatrix} \cdot u(t-1) + \begin{bmatrix} C \cdot B \\ \sum_{i=0}^{1} C \cdot A^i \cdot B \\ \sum_{i=0}^{2} C \cdot A^i \cdot B \\ \vdots \end{bmatrix} \cdot u(t)$$

$$\Delta y(t) = S_{zr} + S_{sr} \cdot u(t)$$

wherein $$\Delta y(t) = \begin{bmatrix} \Delta y(t+1) \\ \Delta y(t+2) \\ \Delta y(t+3) \\ \vdots \end{bmatrix},$$

$$S_{zr} = \begin{bmatrix} C \cdot A^2 \\ C \cdot A^3 \\ C \cdot A^4 \\ \vdots \end{bmatrix} \cdot x(t-1) + \begin{bmatrix} C \cdot A \cdot B \\ C \cdot A^2 \cdot B \\ C \cdot A^3 \cdot B \\ \vdots \end{bmatrix} \cdot u(t-1),$$

$$S_{sr} = \begin{bmatrix} C \cdot B \\ \sum_{i=0}^{1} C \cdot A^i \cdot B \\ \sum_{i=0}^{2} C \cdot A^i \cdot B \\ \vdots \end{bmatrix}$$

In the Formula 4, the symbol $S_{zr}$ indicates the individual zero response characteristics vector, the symbol $S_{sr}$ indicates the individual input response characteristics matrix, and the symbol $\Delta y(t)$ indicates a predicted temperature vector.

The number of rows of the vectors described above is the number of the calculation of the predicted temperature, and they are calculated as many as allowable depending on a control period and a computation processing performance of the CPU 712.

The individual zero response characteristics vector $S_{zr}$ indicates the amount of change due to being influenced by the furnace temperature of the past time and the power supply value of the past time, and the individual input response characteristics matrix $S_{sr}$ indicates the amount of change due to being influenced by the furnace temperature of the current time (that is, time t) and the power supply value of the current time (that is, time t).

Hereinafter, when distinguishing the individual input response characteristics matrix $S_{sr}$, the individual zero response characteristics vector $S_{zr}$ and the predicted temperature vector $\Delta y(t)$ according to the corresponding zone, for example, the individual input response characteristics matrix corresponding to "ZONE A" is represented by $S_{sr-a}$, the individual zero response characteristics vector corresponding to "ZONE B" is represented by $S_{zr-b}$, and the predicted temperature vector corresponding to "ZONE E" is represented by $\Delta y_e(t)$.

The target temperature from the host controller 36 is input to the target temperature column calculating part 806 via the input terminal S, and the target temperature column calculating part 806 calculates a target temperature column vector $S_{tg}$ representing target values of future temperature change in vector form. The target temperature obtained via the input terminal S may include a final target temperature and a ramp rate in addition to the target temperature which changes every moment set for each future time. The ramp rate indicates a rate of change when the temperature is changing from the target temperature of the current time t to the final target temperature, that is, the amount of the temperature change per unit time. For example, when the ramp rate is set to 1° C./min, the temperature changes at a rate of 1° C. per minute. That is, the target temperature column vector $S_{tg}$ is calculated by inputting the target temperature, the final target temperature and the ramp rate. The target temperature column vector $S_{tg}$ is calculated by the number of the furnace temperatures to be controlled (that is, the number of the zones). For the following description, the target temperature column vector $S_{tg}$ is represented by the Formula 5 below.

$$S_{tg}(t) = \begin{bmatrix} S_{tg}(t+1) \\ S_{tg}(t+2) \\ S_{tg}(t+3) \\ \vdots \end{bmatrix} \qquad \text{[Formula 5]}$$

The time and the number of rows in the Formula 5 correspond to the time and the number of rows in the Formula 4. Hereinafter, when distinguishing the target temperature column vector $S_{tg}$ according to the corresponding zone, for example, the target temperature column vector corresponding to "ZONE A" is represented by $S_{tg-a}$ and the target temperature column vector corresponding to "ZONE E" is represented by $S_{tg-e}$.

Since the heater 206 is divided, the set including the temperature history memory part 800 through the target temperature column calculating part 806 is actually provided in a plural number equal to the number of the zones (that is, the number of divisions of the heater 206). However, in order to simplify the illustration, only one set of the temperature history memory part 800 through the target temperature column calculating part 806 is shown in FIG. 6. The same applies to the input terminal S and the input terminal F.

The unified characteristics creating part 808 is configured to create a unified characteristics equation by inputting the individual input response characteristics matrix $S_{sr}$ and the individual zero response characteristics vector $S_{zr}$ obtained by the individual characteristics creating part 804 provided according to the number of zones and inputting the target temperature column vector $S_{tg}$ obtained by the target temperature column calculating part 806 provided according to the number of zones.

First, the individual input response characteristics matrix $S_{sr}$ is modified. The individual input response characteristics matrix $S_{sr}$ indicates the amount of change in the predicted temperature when u(t) is input at time t and u (t) is continuously input thereafter. Assuming that u(t) is not time-invariant and different values u(t) to u(t+Np−1) are input at all the control timings, the second term on the right side of the Formula 4 is represented as below. In the above description, the symbol Np indicates the number of the rows in the Formula 4.

$$\begin{bmatrix} C \cdot B & 0 & 0 & \ldots & 0 \\ C \cdot A \cdot B & C \cdot B & 0 & \ldots & 0 \\ C \cdot A^2 \cdot B & C \cdot A \cdot B & C \cdot B & \ldots & 0 \\ \vdots & \vdots & \vdots & \ddots & \vdots \\ C \cdot A^{Np-1} \cdot B & C \cdot A^{Np-2} \cdot B & C \cdot A^{Np-3} \cdot B & \ldots & C \cdot B \end{bmatrix} \cdot \begin{bmatrix} u(t) \\ u(t+1) \\ u(t+2) \\ \vdots \\ u(t+Np-1) \end{bmatrix}$$

According to the well-known model predictive control, it is assumed that different values u(t) through u(t+Np−1) are input at all the timings of computation processing, and the values described above are calculated and found. However, since the computation processing performance of the CPU 712 is not sufficient, the second term on the right side of the Formula 4 is set as below by limiting the input pattern to two stages according to the embodiments.

$$\begin{array}{cc} \text{HOLDING } u(t+Ncd) & \text{HOLDING } u(t+Ncd) \end{array}$$

$$\begin{bmatrix} C \cdot B & \ldots & 0 & 0 & \ldots & 0 \\ \vdots & & \vdots & \vdots & & \vdots \\ C \cdot A^{Ncd-1} \cdot B & \ldots & C \cdot B & 0 & \ldots & 0 \\ C \cdot A^{Ncd} \cdot B & \ldots & C \cdot A \cdot B & C \cdot B & \ldots & 0 \\ \vdots & & \vdots & \vdots & \ddots & \vdots \\ C \cdot A^{Np-1} \cdot B & \ldots & C \cdot A^{Np-Ncd} \cdot B & C \cdot A^{Np-Ncd-1} \cdot B & \ldots & C \cdot B \end{bmatrix}$$

$$\begin{bmatrix} u(t) \\ \vdots \\ u(t+N_{cd}-1) \\ u(t+N_{cd}) \\ \vdots \\ u(t+Np-1) \end{bmatrix} \begin{array}{l} \text{HOLDING} \\ u(t) \\ \text{HOLDING} \\ u(t+Ncd) \end{array}$$

$$\begin{bmatrix} C \cdot B & 0 \\ \vdots & \vdots \\ \sum_{i=0}^{Ncd-1} C \cdot A^i \cdot B & 0 \\ \sum_{i=1}^{Ncd} C \cdot A^i \cdot B & C \cdot B \\ \vdots & \vdots \\ \sum_{i=Np-Ncd}^{Np-1} C \cdot A^i \cdot B & \sum_{i=0}^{Np-Ncd-1} C \cdot A^i \cdot B \end{bmatrix} \cdot \begin{bmatrix} u(t) \\ u(t+N_{cd}) \end{bmatrix}$$

In the above description, Ncd is the number of input rows to be held in a first stage. The input u(t) of the first stage is held until time (t+Ncd−1). In a second stage, the input u(t+Ncd) is held thereafter. As described above, the individual input response characteristics matrix $S_{sr}$ is modified to obtain the following Formula 6 from the Formula 4

$$\Delta y(t) = S_{zr} + S_{dsr} \cdot u_{cd}(t) \quad \text{[Formula 6]}$$

wherein, $$\Delta y(t) = \begin{bmatrix} \Delta y(t+1) \\ \Delta y(t+2) \\ \Delta y(t+3) \\ \vdots \end{bmatrix},$$

$$S_{zr} = \begin{bmatrix} C \cdot A^2 \\ C \cdot A^3 \\ C \cdot A^4 \\ \vdots \end{bmatrix} \cdot x(t-1) + \begin{bmatrix} C \cdot A \cdot B \\ C \cdot A^2 \cdot B \\ C \cdot A^3 \cdot B \\ \vdots \end{bmatrix} \cdot u(t-1)$$

$$S_{dsr} = \begin{bmatrix} C \cdot B & 0 \\ \vdots & \vdots \\ \sum_{i=0}^{Ncd-1} C \cdot A^i \cdot B & 0 \\ \sum_{i=1}^{Ncd} C \cdot A^i \cdot B & C \cdot B \\ \vdots & \vdots \\ \sum_{i=Np-Ncd}^{Np-1} C \cdot A^i \cdot B & \sum_{i=0}^{Np-Ncd-1} C \cdot A^i \cdot B \end{bmatrix}, u_{cd} = \begin{bmatrix} u(t) \\ u(t+N_{cd}) \end{bmatrix}$$

In the Formula 6, the symbol $S_{dsr}$ indicates an individual input response characteristics matrix $S_{sr}$. When distinguishing the individual input response characteristics matrix $S_{dsr}$ according to the corresponding zone, for example, the individual input response matrix corresponding to "ZONE A" is represented by $S_{dsr-a}$.

Subsequently, all the zones to be controlled are arranged with respect to the Formula 6 and the Formula 5 described above.

$$\begin{bmatrix} \Delta y_a(t+1) \\ \Delta y_b(t+2) \\ \vdots \\ \Delta y_e(t+3) \end{bmatrix} = \begin{bmatrix} S_{zr-a} \\ S_{zr-b} \\ \vdots \\ S_{zr-e} \end{bmatrix} + \begin{bmatrix} S_{dsr-a} \\ S_{dsr-b} \\ \vdots \\ S_{dsr-e} \end{bmatrix} \cdot u_{cd}(t) \quad \text{[Formula 7]}$$

$$= U_{zr} + U_{dsr} \cdot u_{cd}(t)$$

$$U_{tg} = \begin{bmatrix} S_{tg-a}(t) \\ S_{tg-b}(t) \\ \vdots \\ S_{tg-e}(t) \end{bmatrix} \quad \text{[Formula 8]}$$

In a manner described above, the unified characteristics creating part 808 calculates and outputs a unified input response characteristics matrix $U_{dsr}$, a unified zero response characteristics vector $U_{zr}$ and a unified target temperature vector $U_{tg}$ shown in the Formula 7 and the Formula 8.

Subsequently, the constrained optimization calculating part 810 calculates an optimal power supply value of the current time t using an effective constraint method for acquiring a minimizing solution under a predetermined constraint condition. Specifically, the constrained optimization calculating part 810 calculates the optimal power supply value of the current time t by inputting the unified input response characteristics matrix $U_{dsr}$ the unified zero response characteristics vector $U_{zr}$, and the unified target temperature vector $U_{tg}$ acquired by the unified characteristics creating part 808, inputting upper and lower limits (limit values) of each zone used in the limiter 812 described later and using the effective constraint method. The effective constraint method and the operation in the constrained optimization calculating part 810 to which the effective constraint method is applied will be described later in detail.

The limiter 812 is configured to limit the calculation result to a range that the heater 206 can output, and to set the limited result as the power supply value indicating the electric power supplied to the heater 206. In the embodiments, the output of the limiter 812 refers to a ratio from the maximum output of the heater 206, and is limited to 0% to 100% for example. A limit value of the limiter 812 may vary depending on the heat generation temperature of the heater 206. Therefore, the limiter 812 may be configured to acquire the heater temperature via the input terminal H, to derive the limit value from a temperature limit table (not shown) corresponding to the heater temperature, and to limit the acquired heater temperature by the limit value from the temperature limit table. The upper and lower limit values indicating the range that can be outputted by the limiter 812 are available to other processing parts such as the constrained optimization calculating part 810.

The power supply part 718 is configured to control the amount of the power supplied to the heater 206 via the output terminal P such that the amount of the power supplied to the heater 206 corresponds to the power supply value of 0% to 100%.

Since the heater 206 is divided, the set including the limiter 812, the power supply part 718 is actually provided in a plural number equal to the number of the zones (that is, the number of divisions of the heater 206). However, in order to simplify the illustration, only one set of the limiter 812 and the power supply part 718 is shown in FIG. 6. The same applies to the output terminal P.

<First Effective Constraint Method>

The first effective constraint method preferably used in the embodiments will be described. Under the constraint condition of the following Formula 10, the first effective constraint method is used to find a solution vector x that maximizes a value of an evaluation function f(x) given by the following Formula 9.

$$f(x) = c^T \cdot x - \frac{1}{2} x^T \cdot Q \cdot x \qquad \text{[Formula 9]}$$

$$b \geq A \cdot x \qquad \text{[Formula 10]}$$

In the Formula 9 and the Formula 10, the symbols c, Q, b and A are given constant matrices or vectors. In addition, the symbol T indicates transposition. It is possible to obtain the solution vector x using the first effective constraint method by performing a flow shown in FIG. 7.

In a step S201, a solution xk in a range in which the equal sign in the Formula 10 is not valid is selected. Then, let the symbols $A_e$ and $b_e$ be sets of rows where the equal sign is valid among the rows of the Formula 10. In the step S201, both $A_e$ and $b_e$ are empty sets. Also, let the symbols $A_d$ and $b_d$ be sets of rows of the Formula 10 where the equal sign is not valid. In the step S201, $A_d$ is equal to A and $b_d$ is equal to b (that is, $A_d$=A and $b_d$=b).

In a step S203, the following simultaneous equations are solved, and the solutions are given as x and λ. If x is equal to xk (that is, x=xk), the flow proceeds to a step S205. If x is not equal to xk (that is, x≠xk), the flow proceeds to a step S207.

$$\begin{bmatrix} Q & A_e^T \\ A_e & 0 \end{bmatrix} \cdot \begin{bmatrix} x \\ \lambda \end{bmatrix} = \begin{bmatrix} c \\ b_e \end{bmatrix}$$

In the step S205, it is determined whether or not all the elements of λ are zero (0) or more. If all the elements of λ are zero (0) or more, the flow proceeds to a step S213. Otherwise, the flow proceeds to a step S211.

In the step S207, α is calculated according to the following Formula 11. In the Formula 11, the symbols $b_i$ and $a_i$ are a row extracted from $A_d$ and $b_d$, respectively. If α is equal to 1 (that is, α=1), the flow proceeds to a step S205. If α is less than 1 (that is, α<1), the flow proceeds to a step S209

$$\overline{\alpha} = \min_{i \in d} \left\{ \begin{bmatrix} \frac{b_i - a_i \cdot x_k}{a_i \cdot (x - x_k)} & (0 < \text{DENOMINATOR}) \\ 1 & (\text{DENOMINATOR} \leq 0) \end{bmatrix} \right\} \qquad \text{[Formula 11]}$$

$$\alpha = \begin{cases} \overline{\alpha} & (0 < \overline{\alpha} < 1) \\ 1 & (1 \leq \overline{\alpha}) \end{cases}$$

In the step S209, the constraint $[b_i, a_i]$ used when α less than 1 (α<1) is obtained according to the Formula 11 is deleted from $A_d$ and $b_d$, and added to $A_e$ and $b_e$. Then the flow proceeds to the step S203.

In the step S211, the element of λ which is the minimum with the negative value is selected, the corresponding $[b_i, a_i]$ of the constraints included in A. and be is deleted from $A_e$ and $b_e$, added to $A_d$ and $b_d$. Then, the flow proceeds to the step 203.

In step S213, the flow is ended with the solution x obtained in the step S203 as an optimal solution.

Figure 7:
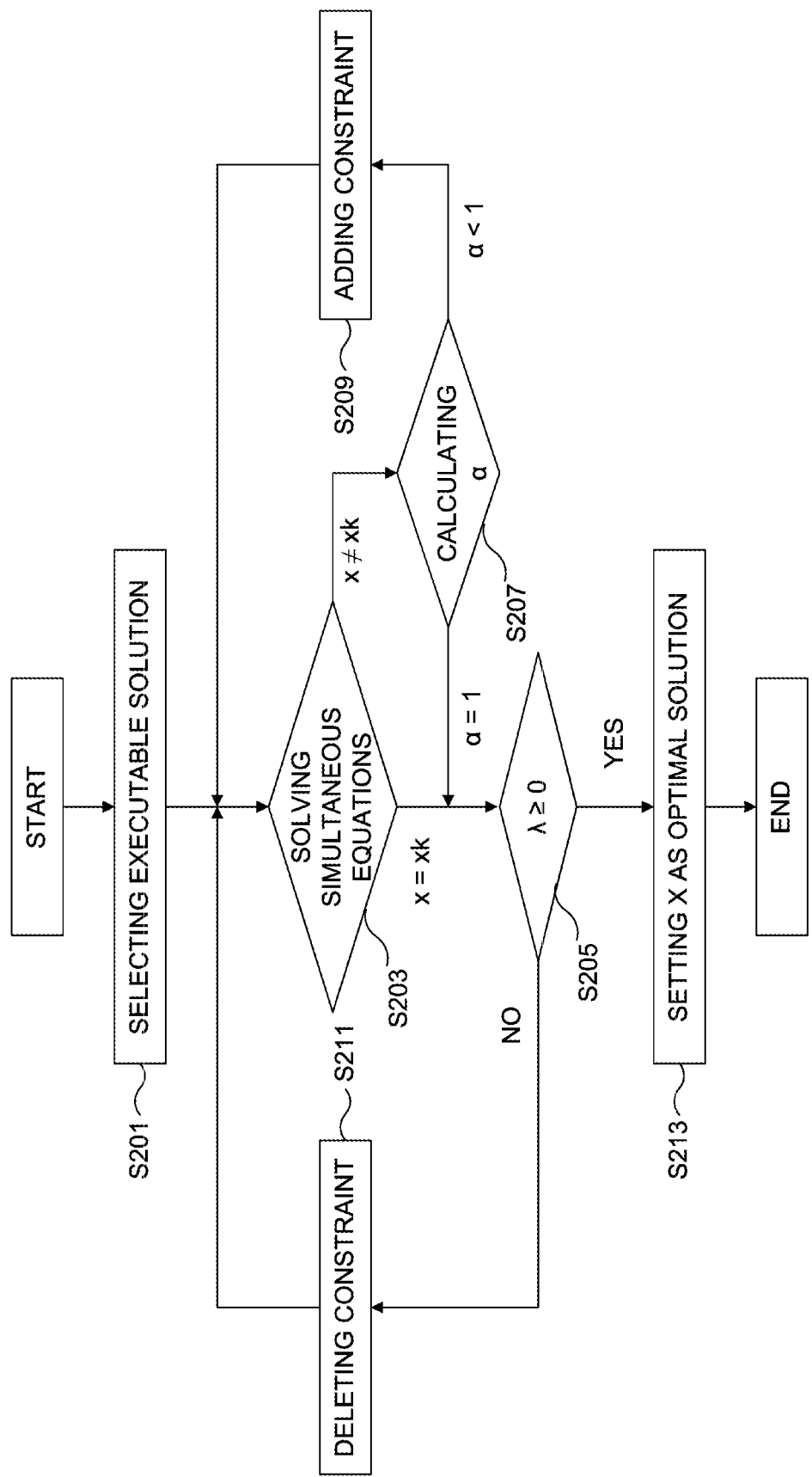
FIG. 7 is a flowchart illustrating a first effective constraint method preferably used in the embodiments described herein.

According to the first effective constraint method shown in FIG. 7, a solution that satisfies the Formula 10 and maximizes the Formula 9 is obtained by searching for a combination of rows in which the equal sign is valid among the rows of the Formula 10 using the accessory multiplier λ.

<Application of Effective Constraint Method in Constraint Optimization Calculating Part 810>

Subsequently, a method of applying the effective constraint method in the constrained optimization calculating part 810 according to the embodiments will be described.

By the unified characteristics creating part 808, a predicted temperature column (the predicted temperature vector) of the furnace temperature in the Formula 7 is obtained, and a target temperature column (the unified target temperature vector) in the Formula 8 is obtained. Therefore, by the constrained optimization calculating part 810, the square of the error (that is, difference) between the target temperature column and the predicted temperature column is used as the evaluation function. The evaluation function V(u(t)) is represented by the following Formula 12.

$$\begin{aligned}
V(u(t)) &= [U_{tg} - (U_{zr} + U_{dsr} \cdot u_{cd}(t))]^T \cdot \qquad \text{[Formula 12]} \\
&\quad [U_{tg} - (U_{zr} + U_{dsr} \cdot u_{cd}(t))] \\
&= [U_{tg} - U_{zr}]^T \cdot [U_{tg} - U_{zr}] - \\
&\quad 2[U_{tg} - U_{zr}]^T \cdot U_{dsr} \cdot u_{cd}(t) + u_{cd}^T(t) \cdot U_{dsr}^T \cdot \\
&\quad U_{dsr} \cdot u_{cd}(t) \\
&= (\text{CONSTANT TERM}) - \\
&\quad 2 \begin{pmatrix} [U_{tg} - U_{zr}]^T \cdot U_{dsr} \cdot u_{cd}(t) - \\ \frac{1}{2} u_{cd}^T(t) \cdot U_{dsr}^T \cdot U_{dsr} \cdot u_{cd}(t) \end{pmatrix}
\end{aligned}$$

-continued $$= \text{(CONSTANT TERM)} - 2\begin{pmatrix} [U_{dsr}^T \cdot [U_{tg} - U_{zr}]]^T \cdot u_{cd}(t) - \\ \frac{1}{2} u_{cd}^T(t) \cdot [U_{dsr}^T \cdot U_{dsr}] \cdot u_{cd}(t) \end{pmatrix}$$

When comparing the Formula 9 with an inside of the parenthesis outside the second term of the Formula 12, the symbols c and Q in the Formula 9 can be replaced by the following equations, respectively.

$$c = U_{dsr}^T \cdot [U_{tg} - U_{zr}], Q = U_{dsr}^T \cdot U_{dsr}$$

In a manner described above, it is possible to obtain a solution maximizing the inside of the parenthesis outside the second term of the Formula 12 by the effective constraint method described above. Therefore, it is possible to obtain a solution minimizing the evaluation function V(u(t)), and to obtain the power supply value minimizing the square of the error (that is, difference) between the target temperature column and the predicted temperature column.

With respect to the constraint condition of the Formula 10, the "ZONE A" through "ZONE C" up to four times before are exemplified for simplicity of illustration. As shown in the following Formula 13, when the power supply values $P_a$, $P_b$ and $P_c$ are given with the upper and lower limit values on the left side of the arrow, respectively, it is possible to apply to the Formula 10 by establishing an inequality expression as shown on the right side of the arrow. In the following Formula 13, the symbols LLa and ULa indicate the upper limit and the lower limit of the power supply value of "ZONE A", respectively, and the symbols LLb, ULb, LLc and ULc indicate the upper and lower limit values of the power supply value of "ZONE B" and "ZONE C", respectively. For example, LLa and ULa are set such that LLa is equal to zero (0) (that is, LLa=0%) and ULa is equal to 80% (that is, ULa=80%).

$$\begin{matrix} LL_a \le p_a(t) \le UL_a \\ LL_b \le p_b(t) \le UL_b \\ LL_c \le p_c(t) \le UL_c \end{matrix} \Rightarrow \begin{bmatrix} UL_a \\ LL_b \\ UL_b \\ LL_b \\ UL_c \\ LL_c \end{bmatrix} \ge \begin{bmatrix} 1 & 0 & 0 \\ -1 & 0 & 0 \\ 0 & 1 & 0 \\ 0 & -1 & 0 \\ 0 & 0 & 1 \\ 0 & 0 & -1 \end{bmatrix} \cdot \begin{bmatrix} p_a(t) \\ p_b(t) \\ p_c(t) \end{bmatrix} \quad \text{[Formula 13]}$$

<Second Effective Constraint Method>

Hereinafter, a second effective constraint method preferably used in the embodiments will be described. In the above-described first effective constraint method shown in FIG. 7, when the computation processing capability (that is, the computation processing performance) of the CPU 712 is not sufficient, the calculation described above may not be completed at a predetermined control cycle in some cases. Therefore, instead of the flow shown in FIG. 7, the solution vector x can be obtained by a flow shown in FIG. 8.

Figure 8:
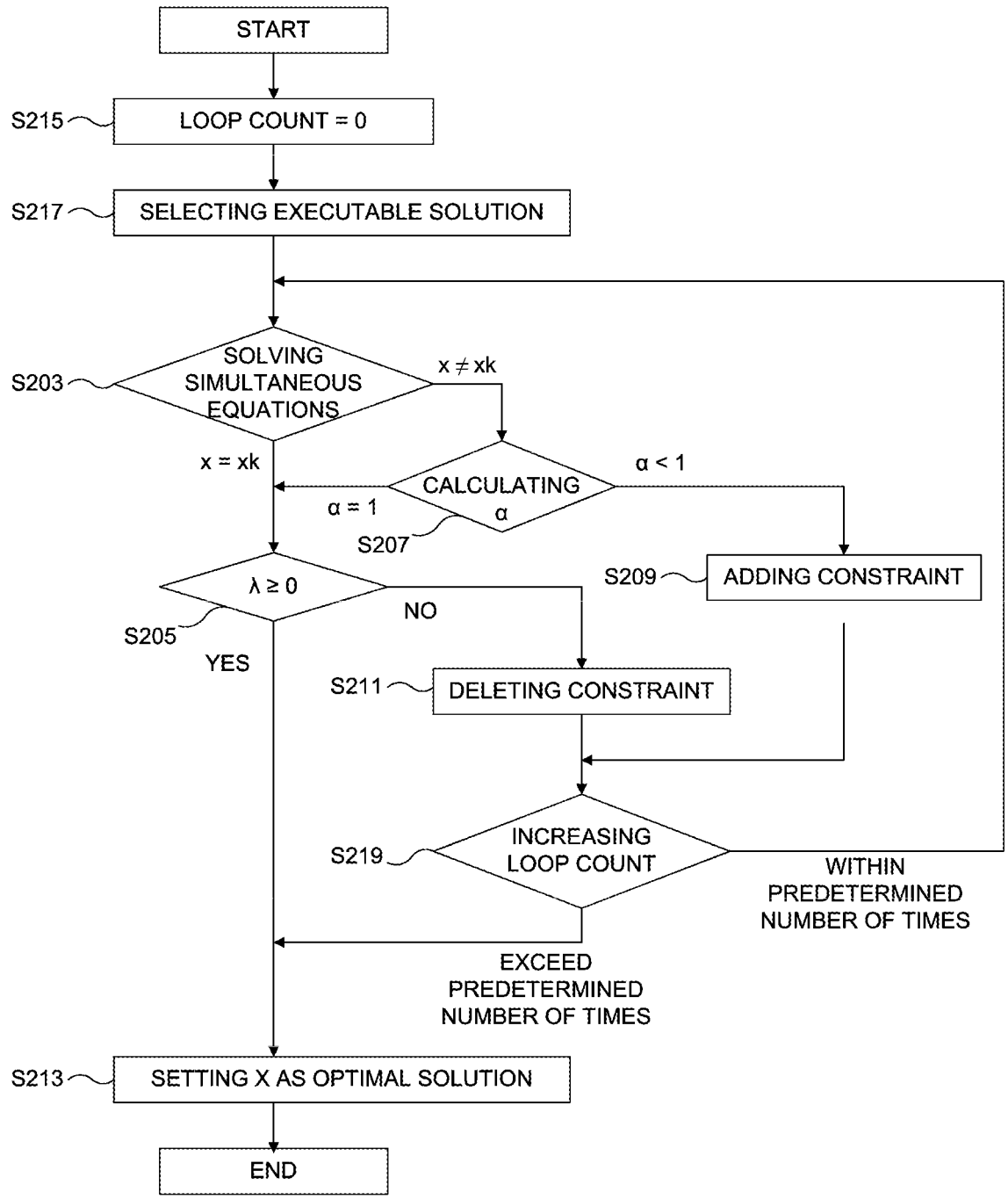
FIG. 8 is a flowchart illustrating a second effective constraint method preferably used in the embodiments described herein.

The differences between the second effective constraint method shown in FIG. 8 and the first effective constraint method shown in FIG. 7 are that a step S215 is added immediately after the start of the flow, the step S201 in FIG. 7 is replaced with a step S217, the flow proceeds to an added step S219 from the step S209 and the step S211, and the flow proceeds to the step S203 or the step S213 by the determination in the step S219. Hereinafter, only the differences from the first effective constraint method will be explained.

In the step S215, a loop count is initialized.

In the step S217, a solution xk in a range in which the equal sign in the Formula 10 is not valid is selected. In preparation for the case where an optimization calculation is aborted during the calculation in the step 219 described later, in particular, a lower limit of the range in which the equal sign in the Formula 10 is not valid may be selected as the solution xk. For example, when Pa(t) is equal to or greater than zero (0) and equal to or less than 100 (that is, 0≤Pa(t)≤100) with respect to the constraint of the power supply value Pa of "ZONE A", the selection solution may be set to "Pa(t)=0.1". Thereby, the constraint added in the step S209 gives priority to the lower limit constraint. As a result, even when the optimization calculation is aborted during the calculation in the step 219, a calculation result can be secured.

In the step S219, the loop count is increased by one (1), and when the loop count is within a predetermined number of times, the flow proceeds to the step S203. When the loop count exceeds the predetermined number of times, the flow proceeds to the step S213, and the flow is ended with the solution x obtained in the step S203 performed just before as an optimal solution.

By using the flow as shown in FIG. 8, it is possible to finish the calculation of the optimal solution with the necessary minimum processing. Therefore, it is possible to complete the calculation within a predetermined control cycle (that is, the predetermined number of times).

Second Embodiment

Figure 9:
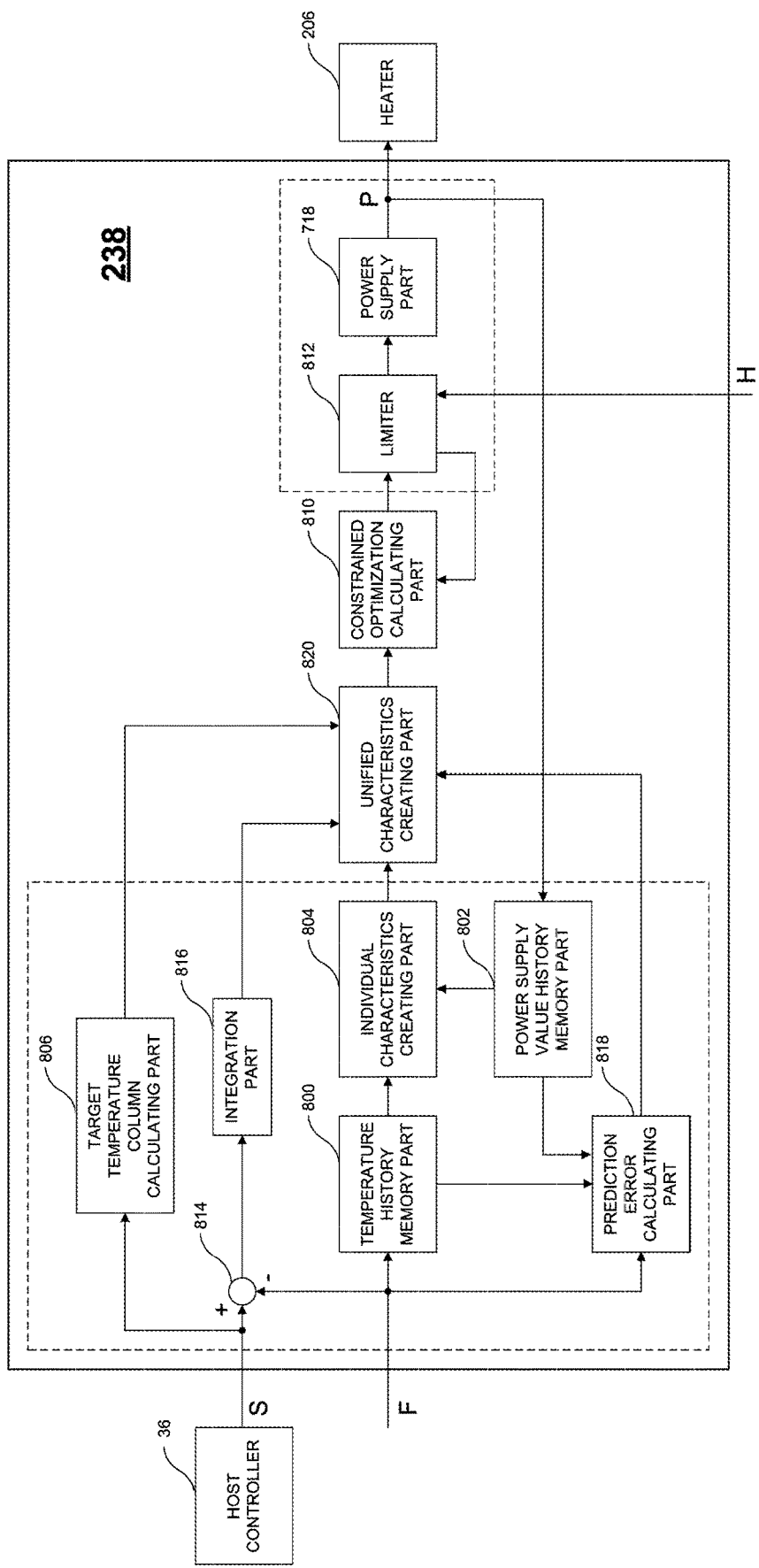
FIG. 9 is a block diagram illustrating a configuration of the temperature controller preferably used in a second embodiment described herein.

FIG. 9 is a block diagram illustrating a configuration of the temperature controller 238 according to the second embodiment described herein. When a temperature control is actually performed according to the configuration shown in FIG. 6, a steady state deviation may not asymptotically approach zero (0). Therefore, the temperature control may be performed according to the configuration shown in FIG. 9 of the second embodiment. According to the second embodiment, a subtraction part 814, an integration part 816 and a prediction error calculating part 818 are added to the configuration shown in FIG. 6, and a unified characteristics creating part 820 is used instead of the unified characteristics creating part 808. Hereinafter, only the parts different from the configuration shown in FIG. 6 described above will be described below, and the same parts as those of the configuration shown in FIG. 6 will not be described in detail.

The subtraction part 814 is provided according to the number of the zones. The target temperature that changes from moment to moment is input via the input terminal S, and the furnace temperature is input via the input terminal F. The subtraction part 814 calculates a deviation between them.

The integration part 816 is provided according to the number of the zones. The integration part 816 integrates the deviation acquired by the subtraction part 814. The calculation method is shown in the following Formula 14.

$$S_{yi}(t-1) = S_{yi}(t-2) + \frac{dev(t-2)}{T_i} \quad \text{[Formula 14]}$$

In the Formula 14, the symbol dev(t) indicates the deviation obtained by the subtraction part 814. An initial value of an integral value is set to zero. In the Formula 14, the symbol Ti indicates an integration constant obtained from the parameter memory area 856. In particular, in order to prevent the integral of the deviation from adversely affecting the control performance, the integration is not performed when the deviation is large. In addition, a so-called ARW (Anti-Reset Windup) function is provided. According to the ARW function, the integration is not performed when the previous power supply value of the corresponding zone is the upper or lower limit values. Since the furnace temperature obtained by the processing at the current time t is treated as y(t−1) (that is, the temperature one time before), the left side of the Formula 14 is set according to the time (t−1) in accordance with y(t−1). When distinguishing the integral value S of the deviation according to the corresponding zone, for example, the integral value of the deviation corresponding to "ZONE A" is represented by $S_{yi-a}$ and the integral value of the deviation corresponding to "ZONE E" is represented by $S_{yi-e}$.

The prediction error calculating part 818 acquires the prediction model from the prediction model memory area 854, acquires the current and past data of the furnace temperature from the temperature history memory area 850, acquires the current and past data of the power supply value from the power supply value history memory area 852, and calculates a prediction error. The prediction error is calculated by the number of furnace temperatures to be controlled (that is, the number of the zones).

First, an error (that is, difference) between the furnace temperature acquired at the current time t and the predicted temperature with respect to the furnace temperature acquired at the current time t is obtained using the Formula 1 Then, the obtained error is low-pass filtered. That is, the error is represented by the following Formula 15.

$$S_{pe}(t-1) = \frac{F_e - 1}{F_e} \cdot S_{pe}(t-2) + \frac{1}{F_e} \cdot (y(t-1) - \Delta y(t-1)) \quad \text{[Formula 15]}$$

In the Formula 15, the symbol Δy(t−1) indicates the predicted temperature related to the previous temperature [that is, the time (t−1)] acquired at the current time t, which is obtained from the Formula 1. The symbol Fe indicates a filter coefficient acquired from the parameter memory area 856. Since the furnace temperature obtained by the processing at the current time t is treated as y(t−1) (that is, the temperature one time before), the left side of the Formula 15 is set according to the time (t−1) in accordance with y(t−1). When distinguishing the prediction error $S_{pe}$ according to the corresponding zone, for example, the prediction error corresponding to "ZONE A" is represented by $S_{pe-a}$ and the prediction error corresponding to "ZONE E" is represented by $S_{pe-e}$.

Similar to the temperature history memory part 800 through the target temperature column calculating part 806, the set including the subtraction part 814 through the prediction error calculating part 818 is actually provided in a plural number equal to the number of the zones (that is, the number of divisions of the heater 206). However, in order to simplify the illustration, only one set of the subtraction part 814 through the prediction error calculating part 818 is shown in FIG. 9. The same applies to the input terminal S and the input terminal F.

The unified characteristics creating part 820 replaces the unified characteristics creating part 808 shown in FIG. 6. The unified characteristics creating part 820 is configured to create a unified characteristics equation by inputting the individual input response characteristics matrix S, and the individual zero response characteristics vector $S_{zr}$ obtained by the individual characteristics creating part 804 provided according to the number of zones, inputting the target temperature column vector $S_{tg}$ obtained by the target temperature column calculating part 806 provided according to number of the zones, inputting the integral value of the deviation obtained by the integration part 816 provided according to number of the zones, and inputting the prediction error obtained by the prediction error calculating part 818 provided according to number of the zones. The added values such as the integral value of the deviation and the prediction error are applied as follows. That is, the Formula 7 and the Formula 8 are replaced as shown in the following Formula 16 and Formula 17, respectively.

$$\begin{bmatrix} \Delta y_a(t) \\ \Delta y_b(t) \\ \vdots \\ \Delta y_e(t) \end{bmatrix} = \begin{bmatrix} S_{zr-a} + S_{pe-a}(t-1) \\ S_{zr-b} + S_{pe-b}(t-1) \\ \vdots \\ S_{zr-e} + S_{pe-e}(t-1) \end{bmatrix} + \begin{bmatrix} S_{dsr-a} \\ S_{dsr-b} \\ \vdots \\ S_{dsr-e} \end{bmatrix} \cdot u_{cd}(t) \quad \text{[Formula 16]}$$

$$= U_{zr} + U_{drs} \cdot u_{cd}(t)$$

$$U_{tg} = \begin{bmatrix} S_{tg-a} + S_{yi-a}(t-1) \\ S_{tg-b} + S_{yi-b}(t-1) \\ \vdots \\ S_{tg-e} + S_{yi-e}(t-1) \end{bmatrix} \quad \text{[Formula 17]}$$

In the Formula 16 and the Formula 17, for example, adding the scalar $S_{pe-a}$ to the vector $S_{zr-a}$ indicates that the scalar $S_{pe-a}$ is added to all elements of the vector $S_{zr-a}$.

In a manner described above, the unified characteristics creating part 820 calculates and outputs the unified input response characteristics matrix $U_{dsr}$, the unified zero response characteristics vector $U_{zr}$ and the unified target temperature vector $U_{tg}$ shown in the Formula 16 and the Formula 17.

According to a control method (also referred to as a "temperature control method") using the configuration shown in FIG. 9, it is possible to reduce the steady state deviation since the prediction error due to various short-term factors such as a noise can be removed at the time of the calculation (control computation) by correcting the predicted temperature column. Regarding the prediction error due to long-term factors such as environmental changes and due to invariable factors such as the deviation of the prediction models, it is possible to eliminate the steady state deviation by correcting the target temperature with the integral value of the deviation.

Third Embodiment

Subsequently, a configuration of the temperature controller 238 according to the third embodiment will be described. According to the third embodiment, the first temperature sensor 263 is not installed in the process furnace 202 of the substrate processing apparatus shown in FIG. 1. When the first temperature sensor 263 is not installed, the heater temperature instead of the furnace temperature is controlled according to the target temperature from the host controller 36. When the heater temperature is controlled in accordance with a control method using the configuration according to the third embodiment, the descriptions related to the configurations shown in FIG. 6 and FIG. 9 are similarly applied by replacing "furnace temperature" with "heater temperature".

Fourth Embodiment

Figure 10:
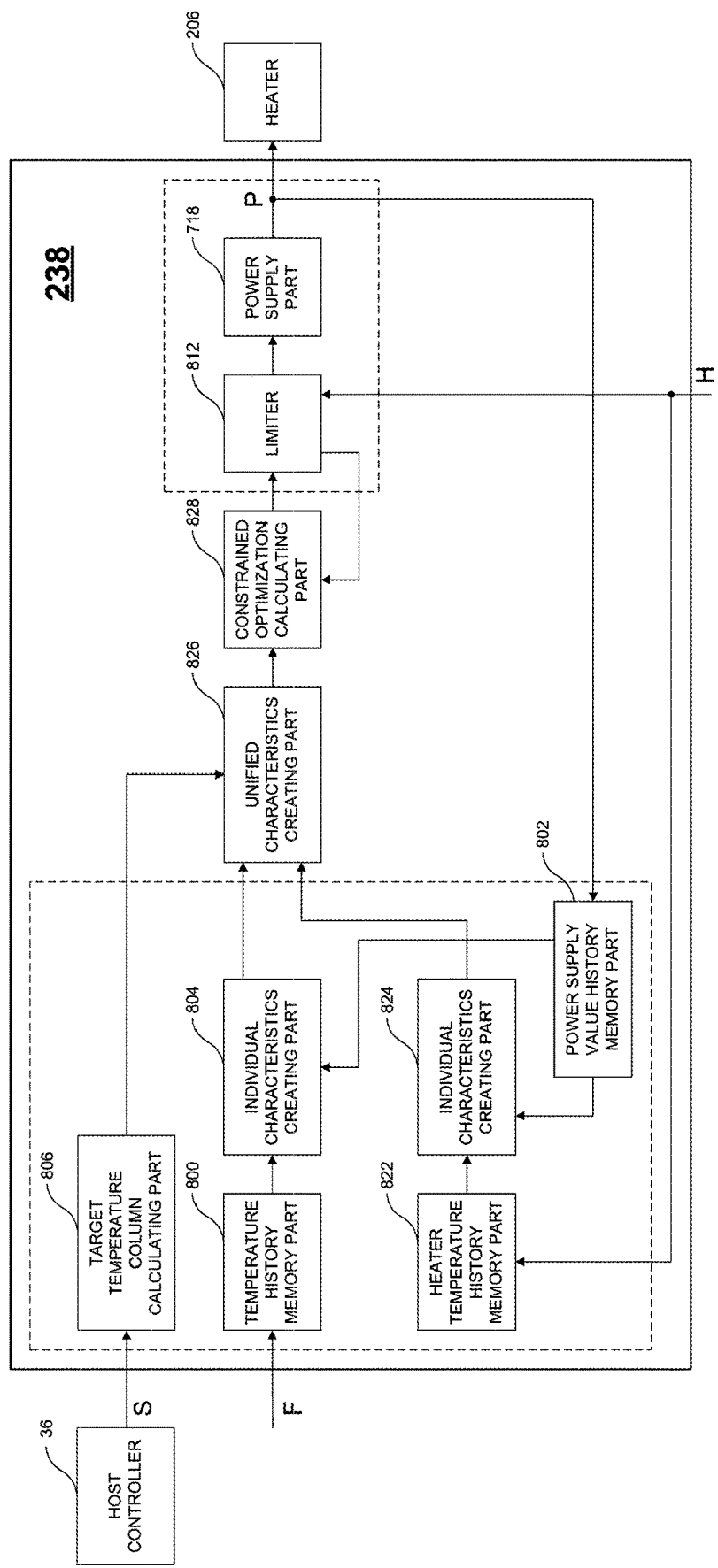
FIG. 10 is a block diagram illustrating a configuration of the temperature controller preferably used in a fourth embodiment described herein.

FIG. 10 is a block diagram illustrating a configuration of the temperature controller 238 according to the fourth embodiment described herein. According to the fourth embodiment, a heater temperature history memory part 822 and an individual characteristics creating part 824 are added to the configuration shown in FIG. 6, and a unified characteristics creating part 826 and a constrained optimization calculating part 828 are used instead of the unified characteristics creating part 808 and the constrained optimization calculating part 810, respectively.

The heater temperature is input to the heater temperature history memory part 822 via the input terminal H, and the heater temperature history memory part 822 stores the heater temperature in the temperature history memory area 850 for a certain period. Specifically, the heater temperature history memory part 822 writes heater temperatures in the sequential order of acquiring them (i.e., from the heater temperature initially acquired to the heater temperature acquired at the time t) with predetermined intervals therebetween into the temperature history memory area 850. When the temperature history memory area 850 is filled with data of the heater temperatures, the oldest data is discarded and new data is written where the oldest data is discarded. According to a manner described above, the data of the heater temperatures from the current time (present time) to the past time is always stored for a certain period.

The individual characteristics creating part 824 acquires the prediction model of the heater temperature of the zone from the prediction model memory area 854, acquires the current and past data of the heater temperature from the temperature history memory area 850, acquires the current and past data of the power supply value from the power supply value history memory area 852, and calculates the individual input response characteristics matrix $S_{sr}$ and the individual zero response characteristics vector $S_{zr}$ described above with reference to the Formula 3 and the Formula 4, respectively. The predicted temperature vector of the heater temperature, that is, $\Delta y_h(t)$ according to the fourth embodiment is represented by the following Formula 18, where an individual input response characteristics matrix $S_{srh}$ indicates the individual input response characteristics matrix of the heater temperature, and an individual zero response characteristics vector $S_{zrh}$ indicates the individual zero response characteristics vector of the heater temperature.

$$\Delta y_h(t) = S_{zrh} + S_{srh} \cdot u(t) \quad \text{[Formula 18]}$$

When distinguishing the individual input response characteristics matrix $S_{srh}$ according to the corresponding zone or the individual zero response characteristics vector $S_{zrh}$ according to the corresponding zone, for example, the individual input response characteristics matrix corresponding to "ZONE A" is represented by $S_{srh-a}$.

Similar to the temperature history memory part 800 through the target temperature column calculating part 806, the number of the set including the heater temperature history memory part 822 and the individual characteristics creating part 824 is actually provided in a plural number equal to the number of the zones (that is, the number of divisions of the heater 206). However, in order to simplify the illustration, only one set of the heater temperature history memory part 822 and the individual characteristics creating part 824 is shown in FIG. 10.

The unified characteristics creating part 826 is configured to create a unified characteristics equation by inputting the individual input response characteristics matrix $S_{sr}$ and the individual zero response characteristics vector $S_{zr}$ obtained by the individual characteristics creating part 804 provided according to number of the zones, inputting the target temperature column vector $S_{tg}$ obtained by the target temperature column calculating part 806 provided according to number of the zones, and inputting the individual input response characteristics matrix $S_{srh}$ and the individual zero response characteristics vector $S_{zrh}$ obtained by the individual characteristics creating part 824 provided according to number of the zones.

The unified characteristics equation is created by the following Formula 19 and Formula 20.

$$\begin{bmatrix} \Delta y_a(t) \\ \Delta y_b(t) \\ \vdots \\ \Delta y_e(t) \\ \Delta y_{h-a}(t) \\ \Delta y_{h-b}(t) \\ \vdots \\ \Delta y_{h-e}(t) \end{bmatrix} = \begin{bmatrix} S_{zr-a} \\ S_{zr-b} \\ \vdots \\ S_{zr-e} \\ S_{zrh-a} \\ S_{zrh-b} \\ \vdots \\ S_{zrh-e} \end{bmatrix} + \begin{bmatrix} S_{dsr-a} \\ S_{dsr-b} \\ \vdots \\ S_{dsr-e} \\ S_{dsrh-a} \\ S_{dsrh-b} \\ \vdots \\ S_{dsrh-e} \end{bmatrix} \cdot u_{cd}(t) \quad \text{[Formula 19]}$$

$$= U_{zr} + U_{drs} \cdot u(t)$$

$$U_{tg} = \begin{bmatrix} S_{tg-a}(t) \\ S_{tg-b}(t) \\ \vdots \\ S_{tg-e}(t) \\ S_{tgh-a}(t) \\ S_{tgh-b}(t) \\ \vdots \\ S_{tgh-e}(t) \end{bmatrix} \quad \text{[Formula 20]}$$

In the Formula 19, the symbols $S_{dsrh-a}$, $S_{dsrh-b}$ through $S_{dsrh-e}$ are obtained by applying the modification explained in the Formula 6 to the individual input response characteristics matrix $S_{srh}$. In the Formula 20, the symbols $S_{tah-a}(t)$, $S_{tah-b}(t)$ through $S_{tah-e}(t)$ indicate the target temperature column vector of the heater temperature obtained by shifting all elements of the target temperature vector of the Formula 5 by a correction temperature. The correction temperature is derived from the difference between the furnace temperature and the heater temperature in a steady state.

The time denoted in the Formula 19 and the Formula 20 corresponds to the time denoted in the Formula 7 and the Formula 8, and the number of rows of the Formula 19 and the Formula 20 is twice that of the Formula 7 and the Formula 8, respectively.

Then, the unified characteristics creating part 826 calculates and outputs the unified input response characteristics matrix $U_{dsr}$, the unified zero response characteristics vector $U_{zr}$ and the unified target temperature vector $U_{tg}$ shown in the Formula 19 and the Formula 20.

Subsequently, the constrained optimization calculating part 828 calculates an optimal power supply value of the current time t using the first effective constraint method or the second effective constraint method. Specifically, the constrained optimization calculating part 828 calculates the optimal power supply value of the current time t by inputting the unified input response characteristics matrix $U_{dsr}$, the unified zero response characteristics vector $U_{zr}$ and the unified target temperature vector $U_{tg}$ acquired by the unified characteristics creating part 826, inputting the upper and lower limit values of each zone used in the limiter 812. The constrained optimization calculating part 828 is different from the constrained optimization calculating part 810. The constrained optimization calculating part 828 applies the effective constraint method by the following method.

For the constrained optimization calculating part 828, the evaluation function is obtained by adding the square of the error (that is, difference) between the target temperature column and the predicted temperature column and the square of the error between the target temperature column of the heater temperature and the predicted temperature column of the heater temperature. However, regarding the addition of the square of the error between the target temperature column of the heater temperature and the predicted temperature column of the heater temperature, the weight W is reflected for each zone. The evaluation function V(u(t)) is represented by the following Formula 21.

$$V(u(t)) = [U_{tg} - (U_{zr} + U_{dsr} \cdot u(t))]^T \cdot W \cdot$$
$$[U_{tg} - (U_{zr} + U_{dsr} \cdot u(t))]$$
$$= [U_{tg} - U_{zr}]^T \cdot W \cdot [U_{tg} - U_{zr}] - 2[U_{tg} - U_{zr}]^T \cdot$$
$$W \cdot U_{dsr} \cdot u(t) + u(t)^T \cdot U_{dsr}^T \cdot W \cdot U_{dsr} \cdot u(t)$$
$$= (\text{CONSTANT TERM}) -$$
$$2\left( \begin{array}{c} [U_{tg} - U_{zr}]^T \cdot W \cdot U_{dsr} \cdot u(t) - \\ \frac{1}{2} u(t)^T \cdot U_{dsr}^T \cdot W \cdot U_{dsr} \cdot u(t) \end{array} \right)$$
$$= (\text{CONSTANT TERM}) -$$
$$2\left( \begin{array}{c} [U_{dsr}^T \cdot W \cdot [U_{tg} - U_{zr}]]^T \cdot u(t) - \\ \frac{1}{2} u(t)^T \cdot [U_{dsr}^T \cdot W \cdot U_{dsr}] \cdot u(t) \end{array} \right)$$

[Formula 21]

wherein, $$c = U_{dsr}^T \cdot W \cdot [U_{tg} - U_{zr}], Q = U_{dsr}^T \cdot W \cdot U_{dsr}$$

By replacing the symbols c and Q in the Formula 9 with the above equations, it is possible to apply the effective constraint method described above.

As shown in the following Formula 22, the weight matrix W shown in the Formula 21 is a diagonal matrix in which 1 is set for the weight for evaluation related to the deviation of the furnace temperature and values $W_a$, $W_b$ through $W_e$ are set for the weights for evaluation related to the deviation of the heater temperature for the corresponding zone, respectively. The values $W_a$, $W_b$ through $W_e$ are between zero (0) and 1, and are acquired from the parameter memory area 856.

$$W = \begin{bmatrix} E & 0 & \cdots & 0 & 0 & 0 & \cdots & 0 \\ 0 & E & \cdots & 0 & 0 & 0 & \cdots & 0 \\ \vdots & \vdots & \ddots & \vdots & \vdots & \vdots & \ddots & \vdots \\ 0 & 0 & \cdots & E & 0 & 0 & \cdots & 0 \\ 0 & 0 & \cdots & 0 & W_a \cdot E & 0 & \cdots & 0 \\ 0 & 0 & \cdots & 0 & 0 & W_b \cdot E & \cdots & 0 \\ \vdots & \vdots & \ddots & \vdots & \vdots & \vdots & \ddots & \vdots \\ 0 & 0 & \cdots & 0 & 0 & 0 & \cdots & W_e \cdot E \end{bmatrix}$$

[Formula 22]

According to the control method using the configuration shown in FIG. 10, by using the heater temperature when controlling the furnace temperature, it is possible to prevent the deterioration of the control performance such as overshoot.

Fifth Embodiment

Figure 11:
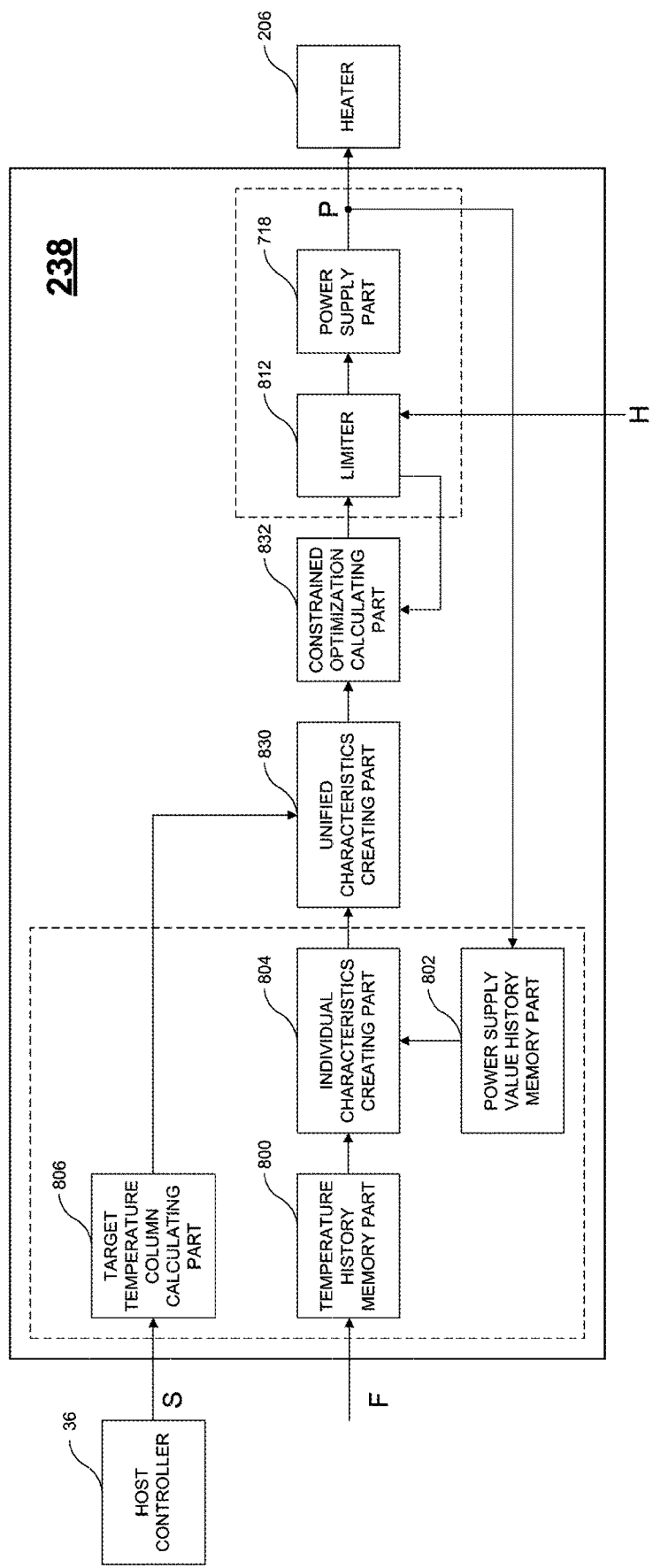
FIG. 11 is a block diagram illustrating a configuration of the temperature controller preferably used in a fifth embodiment described herein.

FIG. 11 is a block diagram illustrating a configuration of the temperature controller 238 according to the fifth embodiment described herein. According to the fifth embodiment, a unified characteristics creating part 830 and a constrained optimization calculating part 832 are used instead of the unified characteristics creating part 808 and the constrained optimization calculating part 810 of the configuration shown in FIG. 6.

The unified characteristics creating part 830 is configured to create a unified characteristics equation by inputting the individual input response characteristics matrix S. and the individual zero response characteristics vector $S_{zr}$ obtained by the individual characteristics creating part 804 provided according to the number of zones, and inputting the target temperature column vector $S_{tg}$ obtained by the target temperature column calculating part 806 provided according to the number of zones.

The unified characteristics equation is created by the following Formula 23 and Formula 24.

$$\begin{bmatrix} \Delta y_a(t) \\ \Delta y_b(t) - \Delta y_a(t) \\ \vdots \\ \Delta y_e(t) - \Delta y_a(t) \end{bmatrix} = \begin{bmatrix} S_{zr-a} \\ S_{zr-b} - S_{zr-a} \\ \vdots \\ S_{zr-e} - S_{zr-a} \end{bmatrix} + \begin{bmatrix} S_{dsr-a} \\ S_{dsr-b} - S_{dsr-a} \\ \vdots \\ S_{dsr-e} - S_{dsr-a} \end{bmatrix} \cdot$$

$$u_{cd}(t)$$
$$= U_{zr} + U_{dsr} \cdot u_{cd}(t)$$

[Formula 23]

$$U_{tg} = \begin{bmatrix} S_{tg-a} \\ S_{tg-b} - S_{tg-a} \\ \vdots \\ S_{tg-e} - S_{tg-a} \end{bmatrix}$$

[Formula 24]

In the Formula 23 and the Formula 24, the difference from "ZONE A" is allocated to the second and subsequent stages. In the Formula 23 and the Formula 24, "ZONE A" is used as the reference of the difference, but a zone other than "ZONE A" may be used the reference of the difference. The time and the number of rows in the Formula 23 and the Formula 24 correspond to those in the Formula 7 and the Formula 8, respectively.

Then, the unified characteristics creating part 830 calculates and outputs the unified input response characteristics matrix $U_{dsr}$, the unified zero response characteristics vector U. and the unified target temperature vector $U_{tg}$ shown in the Formula 23 and the Formula 24.

In the Formula 23 and the Formula 24, for example, with respect to "ZONE B" in the second stage, all of the rows represent the difference with "ZONE A". However, with respect to "ZONE B" in the second stage, for example, the rows related to the difference with respect to "ZONE A" and the rows related to the deviation from the target temperature column may be arranged in half-and-half.

The constrained optimization calculating part 832 calculates an optimal power supply value of the current time t using the effective constraint method described above. Specifically, the constrained optimization calculating part 832 calculates the optimal power supply value of the current time t by inputting the unified input response characteristics matrix $U_{dsr}$, the unified zero response characteristics vector $U_{zr}$, and the unified target temperature vector $U_{tg}$ acquired by the unified characteristics creating part 830, inputting the upper and lower limit values of each zone used in the limiter 812 and using the effective constraint method.

The constrained optimization calculating part 832 applies the effective constraint method by the following method.

For the constrained optimization calculating part 832, the evaluation function is obtained by adding the square of the error (that is, difference) between the target temperature column and the predicted temperature column for the reference zone such as "ZONE A". For a zone other the reference zone, the evaluation function is obtained by adding the square of the error between the target temperature column and the predicted temperature column and the square of the difference between the predicted temperature column of the zone and the predicted temperature column of the reference zone. However, regarding the addition of the square of the difference between the predicted temperature column of the zone and the predicted temperature column of the reference zone, a weight Z is reflected for each zone. The evaluation function V(u(t)) is represented by the following Formula 25.

$$V(u(t)) = [U_{tg} - (U_{zr} + U_{dsr} \cdot u_{cd}(t))]^T \cdot Z \cdot$$
$$[U_{tg} - (U_{zr} + U_{dsr} \cdot u_{cd}(t))]$$
$$= [U_{tg} - U_{zr}]^T \cdot Z \cdot [U_{tg} - U_{zr}] - 2[U_{tg} - U_{zr}]^T \cdot$$
$$Z \cdot U_{dsr} \cdot u_{cd}(t) + u_{cd}^T(t) \cdot U_{dsr}^T \cdot Z \cdot U_{dsr} \cdot u_{cd}(t)$$
$$= (\text{CONSTANT TERM}) -$$
$$2\left( \begin{array}{l} [U_{tg} - U_{zr}]^T \cdot Z \cdot U_{dsr} \cdot u_{cd}(t) - \\ \frac{1}{2} u_{cd}^T(t) \cdot U_{dsr}^T \cdot Z \cdot U_{dsr} \cdot u_{cd}(t) \end{array} \right)$$
$$= (\text{CONSTANT TERM}) -$$
$$2\left( \begin{array}{l} [U_{dsr}^T \cdot Z \cdot [U_{tg} - U_{zr}]]^T \cdot u_{cd}(t) - \\ \frac{1}{2} u_{cd}^T(t) \cdot [U_{dsr}^T \cdot Z \cdot U_{dsr}] \cdot u_{cd}(t) \end{array} \right)$$

[Formula 25]

wherein, $$c = U_{dsr}^T \cdot Z \cdot [U_{tg} - U_{zr}], Q = U_{dsr}^T \cdot Z \cdot U_{dsr}$$

By replacing the symbols c and Q in the Formula 9 with the above equations, it is possible to apply the effective constraint method described above.

As shown in the following Formula 26, the weight matrix Z shown in the Formula 25 is a diagonal matrix in which 1 is set for the weight for evaluation related to the deviation of the reference zone and a value (weight) Z is set for the weight for evaluation related to the deviation of the zone other than the reference zone. For example, the value Z is between 1 and 10, and is acquired from the parameter memory area 856.

$$Z = \begin{bmatrix} E & 0 & 0 & 0 \\ 0 & Z \cdot E & 0 & 0 \\ 0 & 0 & Z \cdot E & 0 \\ 0 & 0 & 0 & Z \cdot E \end{bmatrix},$$

[Formula 26]

E is a unit matrix

According to a control method using the configuration shown in FIG. 11, it is possible to consider the deviation between the zones of the furnace temperature provided in each zone when controlling the furnace temperature. In addition, it is possible to control the elevation and the lowering of the furnace temperature provided in each zone with almost the same temperature history at the same time.

<Automatic Acquisition Procedure of Thermal Characteristics>

Figure 12:
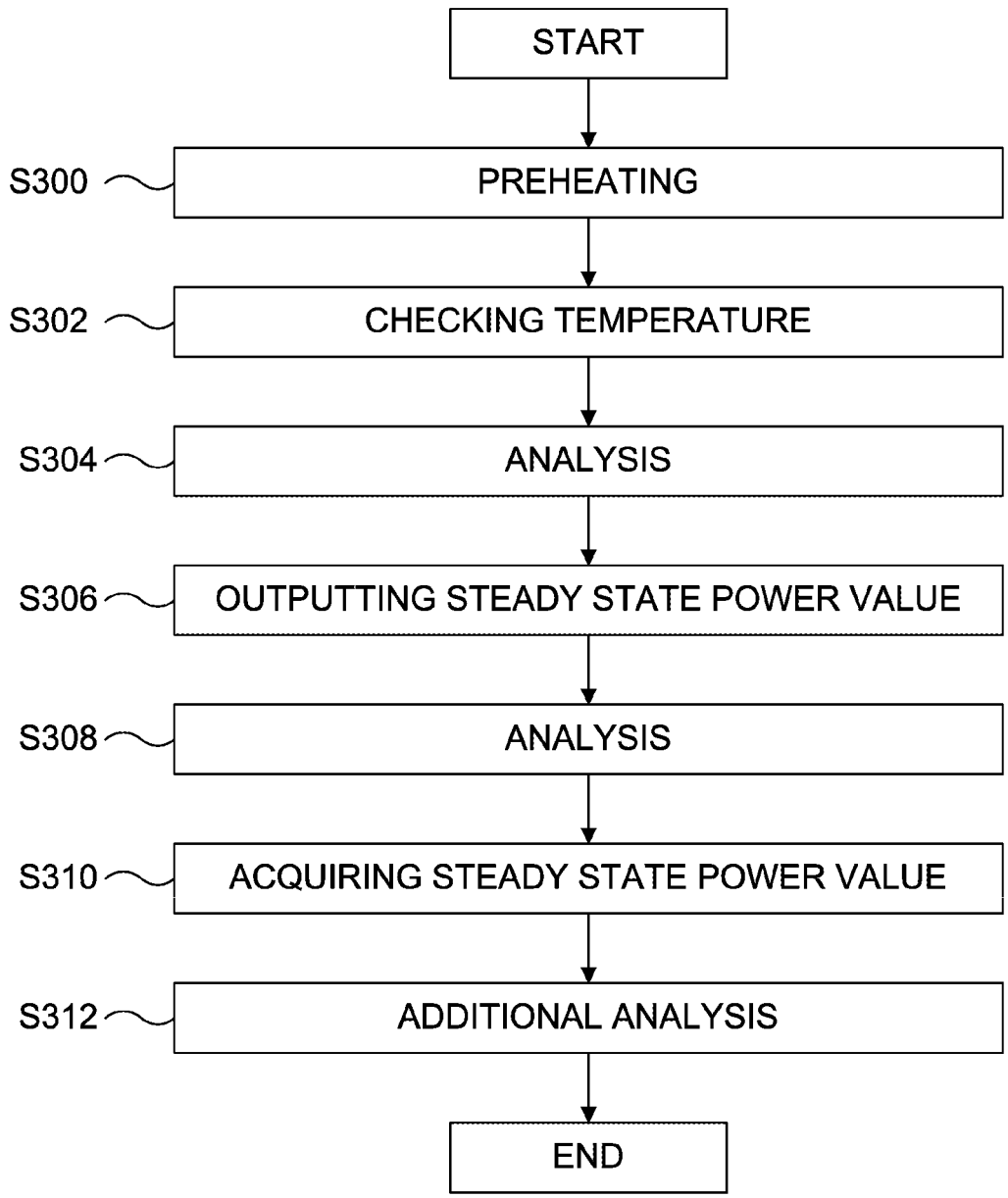
FIG. 12 is a flowchart illustrating a first example of an automatic acquisition procedure of thermal characteristics of the temperature controller preferably used in the embodiments described herein.

Hereinafter, an automatic acquisition procedure of thermal characteristics performed by the temperature controller 238 will be described with reference to FIG. 12. The prediction model necessary for the control performed by the temperature controller 238 is created by the following automatic acquisition procedure of the thermal characteristics, and is stored in the prediction model memory area 854.

First, when starting the automatic acquisition of the thermal characteristics, each reference temperature of the furnace temperature is given by the host controller 36. The temperature controller 238 controls the furnace temperature using feedback control by the PID calculation in a step S300 and a step S302 described below.

In the step S300, the furnace temperature is controlled by the temperature controller 238, and the step S300 is repeatedly performed until the furnace temperature is elevated or lowered to a temperature close to the reference temperature. In the step S300, for example, the parameter used to control the furnace temperature such as the PID parameter (not shown) acquired from the parameter memory area 856 needs to be asymptotically stable. However, the parameter is not necessarily required to be optimal.

In the step S302, the furnace temperature is controlled by the temperature controller 238, and the step S302 is repeatedly performed until the furnace temperature is controlled to the reference temperature and becomes the steady state. In the step S302, for example, the parameter used to control the furnace temperature such as the PID parameter (not shown) acquired from the parameter memory area 856 needs to be asymptotically stable. However, the parameter is not necessarily required to be optimal. In the step S302, when it is determined that the steady state has been reached, the power supply value at that time or an average of the power supply values for a predetermined time period is written as the steady state power value into the prediction model memory area 854. When it is determined that the steady state has been reached, the heater temperature at that time or an average of the heater temperatures for a predetermined time period is written as the reference temperature of the heater temperature into the prediction model memory area 854. In addition, the reference temperature of the furnace temperature is written in the prediction model memory area 854.

In a step S304, a random value is instructed to be output to the heater 206 as the power supply value through the power supply part 718 during a time interval set in advance from the start of the step S304. In addition, the current and past data of the furnace temperature and the heater temperature are acquired from the temperature history memory area 850, and the current and past data of the power supply value are acquired from the power supply value history memory area 852. Then, using the current and past data of the furnace temperature and the current and past data of the power supply value, the prediction model of the furnace temperature is updated and stored. Using the current and past data of the heater temperature and the current and past data of the power supply value, the prediction model of the heater temperature is updated and stored.

The random value described above refers to a value selected randomly from quaternary discrete values centered on the steady state power value stored in the prediction model memory area 854. Then, the power supply value of the zone is changed with a time interval set in advance (for example, one minute). The zone to be changed with the time interval is randomly selected. The updating of the prediction model will be described later.

In a step S306, the steady state power value is instructed to be output to the heater 206 as the power supply value through the power supply part 718 during a time interval set in advance from the start of the step S306. In addition, the current and past data of the furnace temperature and the heater temperature are acquired from the temperature history memory area 850, and the current and past data of the power supply value are acquired from the power supply value history memory area 852. Then, using the current and past data of the furnace temperature and the current and past data of the power supply value, the prediction model of the furnace temperature is updated and stored. Using the current and past data of the heater temperature and the current and past data of the power supply value, the prediction model of the heater temperature is updated and stored.

In a step S308, the same processing as in the step S304 is performed. Additionally, the updated prediction model is evaluated in the step S308. As a result of the evaluation, when it is determined that the prediction model is valid, the flow proceeds to a step S310. The evaluation of the prediction model will be described later.

In the step S310, using the prediction model acquired and evaluated in the step S308, the furnace temperature is controlled using the temperature control method according to the configuration shown in FIG. 9. This is repeatedly performed until the furnace temperature is controlled to the reference temperature and becomes the steady state. When it is determined that the steady state has been reached, the steady state power value, the reference temperature of the heater temperature and the reference temperature are updated in the same manner as in the step S302.

In a step S312, the same processing as in the step S308 is performed. As a result of the evaluation, when it is determined that the prediction model is valid, the automatic acquisition procedure of the thermal characteristics is ended.

Figure 13:
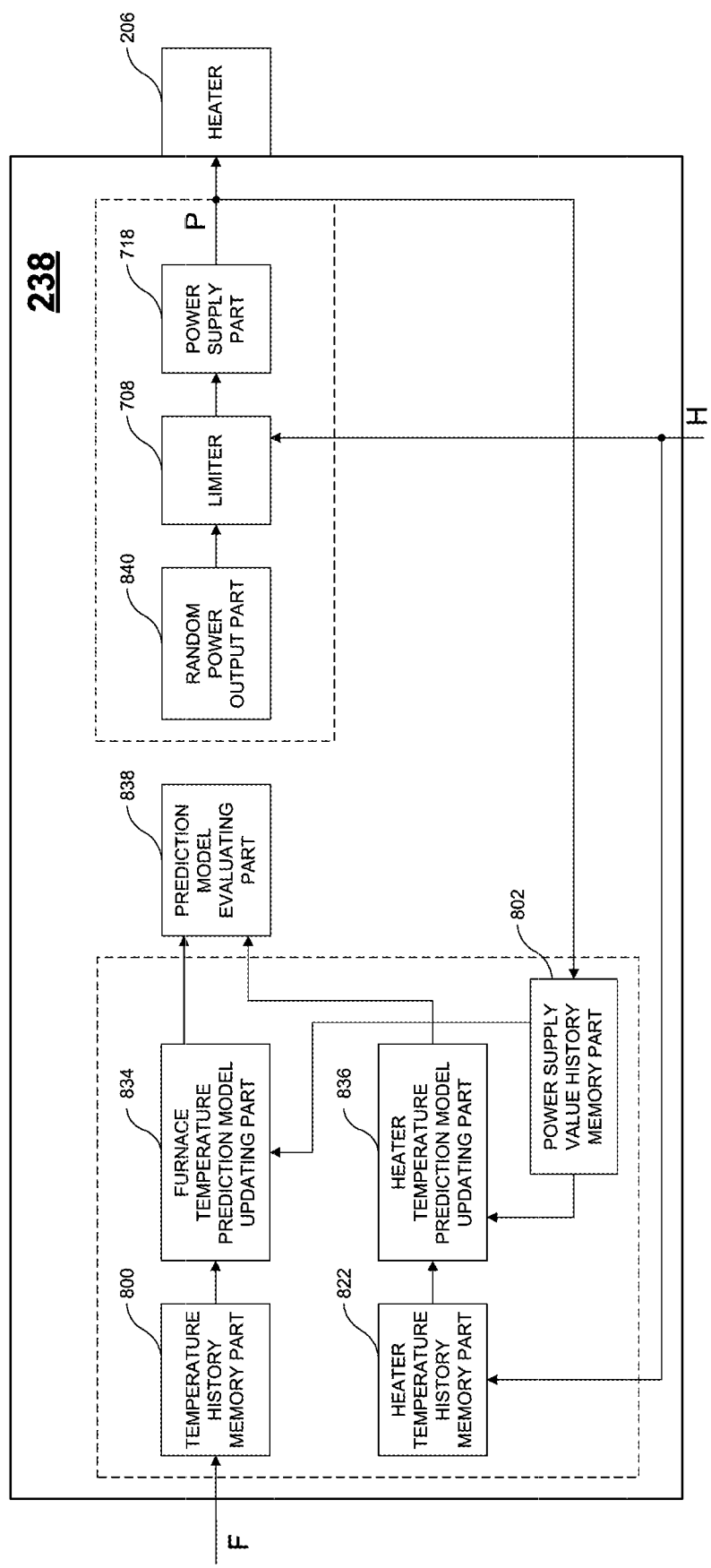
FIG. 13 is a block diagram illustrating a configuration of the temperature controller preferably used to perform S308 and S312 shown in FIG. 12.

FIG. 13 is a block diagram illustrating a configuration of the temperature controller 238 preferably used to perform the steps S304, S308 and S312 of the automatic acquisition procedure of the thermal characteristics.

Referring to FIG. 13, the temperature controller 238 includes components such as a furnace temperature prediction model updating part 834, a heater temperature prediction model updating part 836, a prediction model evaluating part 838 and a random power output part 840. Values such as the reference temperature and the steady state power value which are related to the prediction model and which have been acquired recently are already stored in the prediction model memory area 854.

First, as described above in the step S304, the random power output part 840 outputs the value selected randomly from quaternary discrete values centered on the steady state power value indicating the steady state level of electric power supplied to the limiter 708. In addition, as described later, the number of the random power output part 840 is equal to the number of the zones (that is, the number of divisions of the heater 206). However, each random power output part 840 is associated with other random power output part 840 in order to change the power supply value of the zone with a time interval set in advance (for example, one minute). The zone to be changed with the time interval is randomly selected.

Subsequently, the furnace temperature prediction model updating part 834 acquires the prediction model of the furnace temperature of the zone from the prediction model memory area 854, acquires the current and past data of the furnace temperature from the temperature history memory area 850, acquires the current and past data of the power supply value from the power supply value history memory area 852, and calculates and updates the latest prediction model of the furnace temperature obtained at that time.

Subsequently, the heater temperature prediction model updating part 836 acquires the prediction model of the heater temperature of the zone from the prediction model memory area 854, acquires the current and past data of the heater temperature from the temperature history memory area 850, acquires the current and past data of the power supply value from the power supply value history memory area 852, and calculates and updates the latest prediction model of the heater temperature obtained at that time.

Since the heater 206 is divided, the set including the furnace temperature prediction model updating part 834, the heater temperature prediction model updating part 836 and the random power output part 840 is actually provided in a plural number equal to the number of the zones (that is, the number of divisions of the heater 206). However, in order to simplify the illustration, only one set of the furnace temperature prediction model updating part 834, the heater temperature prediction model updating part 836 and the random power output part 840 is shown in FIG. 13.

Subsequently, the prediction model evaluating part 838 acquires the prediction model of the furnace temperature and the prediction model of the heater temperature provided according to the number of zones at an evaluation interval set in advance (for example, 10 minutes), and evaluates the acquired prediction models until the next acquisition timing after the evaluation interval. As a result of the evaluation, the prediction model evaluating part 838 determines whether or not the acquired prediction models are valid.

<Method of Updating Prediction Model>

Subsequently, a method of updating the prediction model performed by the furnace temperature prediction model updating part 834 and the heater temperature prediction model updating part 836 shown in FIG. 13 through the steps S304, S308 and S312 described above will be described. As described below, the prediction model of the furnace temperature and the prediction model of the heater temperature can be updated by the same process. The method of updating the prediction model according to the embodiments described herein may be performed using a method called sequential least squares method. The Formula 1 is represented by the following Formula 27 using a matrix and a vector.

$$\Delta y(t) = x^T(t) \cdot \theta(t) \qquad \text{[Formula 27]}$$

wherein $$x(t) = \begin{bmatrix} y(t-1) \\ y(t-2) \\ p_a(t-1) \\ \vdots \\ p_a(t-n) \\ p_b(t-1) \\ \vdots \\ p_b(t-n) \\ \vdots \\ p_e(t-n) \\ 1 \end{bmatrix}, \theta(t) = \begin{bmatrix} a_1(t) \\ a_2(t) \\ ma_1(t) \\ \vdots \\ ma_n(t) \\ mb_1(t) \\ \vdots \\ mb_n(t) \\ \vdots \\ me_n(t) \\ bi \end{bmatrix}$$

In the Formula 27, the time t indicates the time when the current processing is performed. The latest data among the elements of x(t) is set to y(t−1) since the time when the temperature and the power supply value are obtained by the current processing at the time (t−1) as described above.

The coefficients θ(t) of the latest prediction model shown in the Formula 27 is calculated as shown in the following Formula 28.

$$\theta(t)=\theta(t-1)+\eta(t)\cdot k(t) \quad \text{[Formula 28]}$$

wherein $$k(t) = \frac{P(t-1)\cdot x(t-1)}{\rho + x^T(t-1)\cdot P(t-1)\cdot x(t-1)}$$

$$\eta(t) = y(t-1) - x^T(t-1)\cdot\theta(t-1)$$

$$P(t) = \frac{1}{\rho}(P(t-1) - k(t)\cdot x^T(t-1)\cdot P(t-1))$$

In the Formula 28, y(t−1) indicates a temperature acquired currently (that is, acquired at time t), which is the furnace temperature or the heater temperature of the prediction model. The symbol ρ indicates a parameter called a forgetting factor, and is acquired from the parameter memory area 856. The symbol P(t) indicates a coefficient error correlation matrix. For example, a unit matrix (also referred to as an "identity matrix") having elements of, for example, 100 to 1,000 is set as an initial value of the coefficient error correlation matrix P(t).

Depending on the input x(t), θ(t) obtained by the Formula 28 may be inappropriate of estimating the temperature or the temperature may be oscillated when the temperature is controlled using θ(t). Therefore, when the first through fourth conditions for updating the model described below are met, instead of following the Formula 28, the coefficient error correlation matrix P(t) and the coefficient θ(t) is set to the same value as the previous time.

The first condition for updating the model is a condition in which the temperature as the object of the prediction model deviates from around the reference temperature (for example, ±50° C.).

The second condition for updating the model is a condition in which at least one element of the coefficient θ(t) of the prediction model deviates from a range set in advance (for example, −100 to +100).

The third condition for updating the model is a condition in which the sum of $ma_1(t)$ through $ma_n(t)$, $mb_1(t)$ through $mb_n(t)$, . . . , $me_1(t)$ through $me_n(t)$ among the elements of the coefficient θ(t) of the prediction model is negative.

The fourth condition for updating the model is a condition in which a transfer function constituted by $a_1(t)$ and $a_2(t)$ among the elements of the coefficient θ(t) of the prediction model is unstable.

The transfer function may be represented as below.

$$\frac{1}{1 - a_1(t)\cdot z^{-1} - a_2(t)\cdot z^{-2}}$$

However, when the number of the calculation in the Formula 28 is small, depending on the input x(t), the first to fourth conditions for updating the model may be met successively. When the first to fourth conditions for updating the model are met successively, the prediction model having a desired accuracy may not be obtained after all. Therefore, it is also possible to update the coefficient θ(t) of the prediction model by ignoring the first to fourth conditions for updating the model for a predetermined number of times set in advance.

When the coefficient θ(t) of the prediction model obtained by the Formula 28 does not correspond to any one of the first to fourth conditions described above, the coefficient θ(t) is stored in the prediction model memory area 854 with the coefficient error correlation matrix P(t).

The coefficient θ(t) of the prediction model is determined when the result of the evaluation is appropriate in the steps S308 and S312 described above. The coefficient θ(t) is read out and used by the components such as the individual characteristics creating part 804 shown in FIG. 6, the individual characteristics creating part 824 shown in FIG. 10 and the prediction error calculating part 818 shown in FIG. 9.

<Evaluation Method of Prediction Model>

Hereinafter, an evaluation method of the prediction model performed by the prediction model evaluating part 838 shown in FIG. 13 in the steps such as the step S304 described above will be described.

The prediction model evaluating part 838 acquires the prediction model of the furnace temperature and the prediction model of the heater temperature at an evaluation interval set in advance (for example, 10 minutes), and evaluates the acquired prediction models before the next acquisition timing. When all of the first to third conditions related to the evaluation method described below are satisfied, the prediction model evaluating part 838 determines that the acquired prediction models are valid.

The first condition related to the evaluation method is a condition in which all of the acquired prediction models do not correspond to any of the first through fourth conditions for updating the model described above.

The second condition related to the evaluation method is a condition in which the maximum value of Cvg(t) obtained by the following Formula 29 for all of the prediction models is equal to or less than a convergence determination value set in advance. The symbol Cvg(t) indicates a total sum of change amounts of the prediction model coefficients, and is calculated at all the timings at which the prediction models are updated.

$$Cvg(t)=[\theta(t)-\theta(t-1)]^T\cdot[\theta(t)-\theta(t-1)] \quad \text{[Formula 29]}$$

The third condition related to the evaluation method is a condition in which all of the values of the prediction error Epe(t) obtained using prediction model are equal to or less than an error judgment value set in advance. The prediction error Epe(t) is calculated at all the timings of processing with the evaluation interval. The prediction error Epe(t) in the evaluation method is calculated by the following Formula 30.

$$E_{pe}(t)=y(t-1)-\Delta y(t-1) \quad \text{[Formula 30]}$$

wherein, $$\Delta y(t-1) = x^T(t-1)\cdot\theta$$

-continued $$\theta = \begin{bmatrix} a_1 \\ a_2 \\ ma_1 \\ \vdots \\ ma_n \\ mb_1 \\ \vdots \\ mb_n \\ \vdots \\ me_n \\ bi \end{bmatrix}$$

The coefficient θ of the prediction model shown in the Formula 30 is obtained by the first processing of the evaluation interval, and is set to a constant since it is unchanged until the next acquisition processing of acquiring the coefficient θ is performed after the evaluation interval has elapsed. Then, the input x(t) is set as follows in the first processing of the evaluation interval.

$$x(t-1) = \begin{bmatrix} y(t-2) \\ y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$

Then, the input x(t) is set as follows in the second processing of the evaluation interval.

$$x(t-1) = \begin{bmatrix} \Delta y(t-2) \\ y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$

Then, the input x(t) is set as follows in the third processing of the evaluation interval.

$$x(t-1) = \begin{bmatrix} \Delta y(t-2) \\ \Delta y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$

That is, at the timing of the first processing of acquiring the prediction model for the evaluation, the current and past measurement temperatures (that is, the current and past data) acquired from the temperature history memory area 850 are used as the past temperature which is the basis of the prediction. However, at the timing of the next processing such as the second processing, the predicted temperatures calculated in the previous processing are used.

<Second Example of Automatic Acquisition Procedure of Thermal Characteristics>

The first temperature sensor 263 may not be installed in the process furnace 202 of the substrate processing apparatus shown in FIG. 1. When the first temperature sensor 263 is not installed, only the predictive model of the heater temperature is created using the second temperature sensor 264 in the automatic acquisition procedure of the thermal characteristics.

When starting the automatic acquisition of the thermal characteristics, each reference temperature of the heater temperature is given by the host controller 36.

The temperature controller 238 controls the heater temperature using feedback control by the PID calculation in the step S300 and the step S302 described above shown in FIG. 12.

In the step S302, when it is determined that the steady state has been reached, the power supply value at that time or an average of the power supply values for a predetermined time period is written as the steady state power value into the prediction model memory area 854. When it is determined that the steady state has been reached, the heater temperature at that time or an average of the heater temperatures for a predetermined time period is written as the reference temperature of the heater temperature into the prediction model memory area 854.

In the step S304 and thereafter, only the prediction model of the heater temperature is updated and evaluated.

<Second Prediction Model>

Regarding the prediction model memory area 854, it may be necessary to set in advance the value n of Formula 1 to a sufficiently large value in order to ensure the predicted temperature sufficiently to be accurate. However, since the computation processing performance of the CPU 712 may be not sufficient, the control computation may not be finished at a predetermined control cycle in some cases when the value n is increased. Therefore, instead of the prediction model shown in the Formula 1, a prediction model shown in the following Formula 31 may be used as a second prediction model.

$$\Delta y(t) = a_1 \cdot y(t-k) + a_2 \cdot y(t-2k) + ma_1 \cdot p_a(t-k) + ma_2 \cdot p_a(t-2k) + \ldots + ma_n \cdot p_a(t-nk)$$

$$+ mb_1 \cdot p_b(t-k) + mb_2 \cdot p_b(t-2k) + \ldots + mb_n \cdot p_b(t-nk)$$

$$+mc_1 \cdot p_c(t-k)+mc_2 \cdot p_c(t-2k)+\ldots+mc_n \cdot p_c(t-nk)$$

$$+md_1 \cdot p_d(t-k)+md_2 \cdot p_d(t-2k)+\ldots+md_n \cdot p_d(t-nk)$$

$$+me_1 \cdot p_e(t-k)+me_2 \cdot p_e(t-2k)+\ldots+me_n \cdot p_e(t-nk)+bi \quad \text{[Formula 31]}$$

In the Formula 31, the symbol k is a natural number such as two (k=2) and ten (k=10), the symbols y(t−k) and y(t−2k) indicates the deviations of the temperature k times before [that is, at time (t−k)] and 2k times before [that is, at time (t−2k)] from the reference temperature, respectively. In addition, the symbols $p_a(t-k)$, $p_a(t-2k)$ through $p_a(t-nk)$ indicate deviations of the power supply values of "ZONE A" k times before, 2k times before through nk times before [that is, at time (t−nk)] from the steady state power value, respectively, the symbols $p_b(t-k)$, $p_b(t-2k)$ through $p_b(t-nk)$ indicate deviations of the power supply values of "ZONE B" k times before, 2k times before through nk times before from the steady state power value, respectively, the symbols $p_c(t-k)$, $p_c(t-2k)$ through $p_c(t-nk)$ indicate deviations of the power supply values of "ZONE C" k times before, 2k times before through nk times before from the steady state power value, respectively, the symbols $p_d(t-k)$, $p_d(t-2k)$ through $p_d(t-nk)$ indicate deviations of the power supply values of "ZONE D" k times before, 2k times before through nk times before from the steady state power value, respectively, and the symbols $p_e(t-k)$, $p_e(t-2k)$ through $p_e(t-nk)$ indicate deviations of the power supply values of "ZONE E" k times before, 2k times before through nk times before from the steady state power value, respectively. The Formula 31 coincides with the Formula 1 when k is 1 (that is, k=1).

That is, in the Formula 31, data up to nk times before is used as the basis for estimating the predicted temperature, but only data for every k samples is used to save the calculation amount.

Alternatively, when only the data for every k samples are used, abnormal values due to factors such as the noise may be introduced. Therefore, the data for each k samples may be used after being subjected to low-pass filtering such as the simple moving average as shown in the following Formula 32.

$$\Delta y(t)=a_1 \cdot y_{ave}(t-k)+a_2 \cdot y_{ave}(t-2k)$$

$$+ma_1 \cdot p_{ave-a}(t-k)+ma_2 \cdot p_{ave-a}(t-2k)+\ldots+ma_n \cdot p_{ave-a}(t-nk)$$

$$+mb_1 \cdot p_{ave-b}(t-k)+mb_2 \cdot p_{ave-b}(t-2k)+\ldots+mb_n \cdot p_{ave-b}(t-nk)$$

$$+\ldots$$

$$+me_1 \cdot p_{ave-e}(t-k)+me_2 \cdot p_{ave-e}(t-2k)+\ldots+me_n \cdot p_{ave-e}(t-nk)+bi \quad \text{[Formula 32]}$$

In the following Formula 32, for example, the symbols $y_{ave}(t)$ and $p_{ave-a}(t)$ is represented as belows.

$$y_{ave}(t)=\frac{\sum_{i=1-k}^{k-1} y(t-i)}{2k-1} \text{ or } p_{ave-a}(t)=\frac{\sum_{i=0}^{k-1} p_a(t-i)}{k}.$$

By setting the prediction model as shown in the Formula 31 or the Formula 32, even when the frequency component included in the thermal characteristics is relatively small, it is possible to accurately acquire the predicted temperature and to reduce the amount of the control computation.

<Selective Use of Prediction Model>

As described above, the prediction model memory area 854 stores a plurality of pairs of prediction model respectively corresponding to a plurality of temperature ranges, wherein each pair is constituted by the prediction model of the heater temperature in every zone of the heater and that of the furnace temperature in every zone of the heater.

The prediction model related to the heater temperature and the furnace temperature in each zone is obtained by repeating the above-described automatic acquisition procedure of the thermal characteristics in each temperature range as shown in a flow chart of FIG. 14. For example, firstly, the target temperature is set to 500° C. and the temperature is controlled by a conventional control method (S400). When the furnace temperature is elevated to 500° C. and is stabilized, the thermal characteristics such as the furnace temperature, the heater temperature and the power supply value are automatically acquired with a temperature around 500° C. as the reference temperature to create a prediction model (S402). Subsequently, when the target temperature is set to 600° C. and the furnace temperature is elevated to 600° C. (S404), the thermal characteristics are automatically acquired with a temperature around 600° C. as the reference temperature to create a prediction model (S406). Subsequently, when the target temperature is set to 700° C. and the furnace temperature is elevated to 700° C. (S408), the thermal characteristics are automatically acquired with a temperature around 700° C. as the reference temperature to create a prediction model (S410). In a manner described above, the thermal characteristics are acquired in a plurality of temperature ranges, and the prediction models are created.

When acquiring the prediction model from the prediction model memory area 854 by the components such as the individual characteristics creating part 804 shown in FIG. 6, the prediction error calculating part 818 shown in FIG. 9 and the individual characteristics creating part 824 shown in FIG. 10, the reference temperature is set according to the target temperature obtained from the host controller 36, and a prediction model whose reference temperature is closest to the reference temperature set according to the target temperature is selected.

As described above, it is assumed that the reference temperature and the steady state power value have different values depending on the target temperature ranges, and that they are nonlinear. In addition, it is assumed that the increasing characteristics and the decreasing characteristics of the temperature may vary depending on the target temperature ranges. Even under the above-described conditions, it is possible to control the temperature appropriately.

Example

An inner temperature of the furnace is elevated from 400° C. to 800° C. at a rate of 50° C./min according to an example of the embodiments and a comparative example. In the example according to the embodiments, the temperature controller 238 that performs the temperature control using the above-described prediction model is used, and in the comparative example, a temperature controller that performs the temperature control using the PID control conventionally used.

In the comparative example, the overshoot occurs in a range of 10° C. before reaching the steady state at the target temperature of 800° C., whereas the overshoot can be suppressed to a range of ±3° C. in the example. The deviation between the zones of the process furnace 202 is ±20° C. in the comparative example, whereas the deviation can be suppressed to ±10° C. in the example.

As described above in detail, according to the temperature controller 238 of the embodiments, it is possible to suppress the overshoot and to reduce the deviation between the zones. In addition, even when the deviation in the temperature characteristic of each heater is large or an engineer in charge cannot have sufficient time, it is possible to automatically acquire the thermal characteristics, and to obtain an optimal control method with easily adjusting the parameters or without adjusting the parameters. Therefore, it is possible to obtain the expected device performance easily.

While the above-described embodiments and the example are described in detail, the above-described technique is not limited thereto. The above-described technique may be modified in various ways without departing from the gist thereof.

For example, the above-described embodiments are described by way of an example in which the process such as the oxidation process and the diffusion process is performed to the wafer 200. For example, an oxide film may be formed on the wafer 200 according to the oxidation process. However, the above-described technique is not limited thereto. The above-described technique may be applied when various films other than the oxide film such as a nitride film (SiN film) and a metal oxide film are formed on the wafer 200.

For example, the above-described embodiments are described by way of an example in which a semiconductor manufacturing apparatus for processing a semiconductor wafer, such as the substrate processing apparatus is used. However, the above-described technique is not limited thereto. The above-described technique may be applied to an LCD (Liquid Crystal Display) manufacturing apparatus for processing a glass substrate.

According to some embodiments in the present disclosure, the temperature control is performed while maintaining the performance of controlling the inner temperature of the furnace at a high level.

What is claimed is:

1. A method of manufacturing a semiconductor device, comprising:
    (a) acquiring temperature data of at least one of a heater temperature defined by a temperature of a heater and a furnace temperature defined by an inner temperature of a process chamber, and acquiring a power supply value indicating an electric power supplied to the heater;
    (b) acquiring a reference temperature of the temperature data;
    (c) creating a predetermined equation using a prediction model of estimating a predicted temperature of the temperature data;
    (d) calculating a solution of minimizing a deviation between the reference temperature and the predicted temperature based on the predetermined equation; and
    (e) outputting a calculated power supply value calculated from the solution, and processing a substrate while controlling heating of the heater based on the calculated power supply value,
    wherein (c) comprises:
    acquiring a prediction model of predicting the furnace temperature corresponding to each zone of the heater divided into a plurality of zones, current and past data of the furnace temperature and current and past data of the power supply value, respectively, and calculating an individual input response characteristics matrix indicating an amount of change due to being influenced by the furnace temperature of current time and the power supply value of the current time and an individual zero response characteristics vector indicating an amount of change due to being influenced by the furnace temperature of past time and the power supply value of the past time, respectively, for each zone of the heater;
    inputting a target temperature set for each future time, a final target temperature and a ramp rate indicating an amount of temperature change per unit time, and calculating a target temperature column vector representing target values of future temperature change in vector form; and
    creating a unified characteristics equation serving as the predetermined equation constituted by a unified input response characteristics matrix, a unified zero response characteristics vector and a unified target temperature vector where characteristics of the plurality of zones are unified, wherein the unified characteristics equation is created using the individual input response characteristics matrix calculated for each zone of the heater, the individual zero response characteristics vector calculated for each zone of the heater and the target temperature column vector for each zone of the heater.

2. The method of claim 1, wherein (d) further comprises: inputting the unified characteristics equation and upper and lower limits of the power supply value of each zone of the heater, and calculating the power supply value of the current time by obtaining a solution of minimizing an evaluation function under a predetermined constraint condition using an effective constraint method, wherein the evaluation function evaluates a difference between the unified target temperature vector and a predicted temperature vector obtained by the unified input response characteristics matrix and the unified zero response characteristics vector.

3. The method of claim 2, wherein the unified characteristics equation comprises a predicted temperature column of the furnace temperature and a target temperature column of the furnace temperature.

4. The method of claim 3, wherein the unified characteristics equation is capable of being used to minimize a square of an error between the target temperature column and the predicted temperature column.

5. The method of claim 1, wherein (d) further comprises: inputting a unified characteristics equation serving as the predetermined equation and upper and lower limits of the power supply value of each zone of the heater divided into a plurality of zones, and calculating the power supply value of the current time by obtaining a solution of minimizing a value of an evaluation function under a predetermined constraint condition using an effective constraint method, wherein the evaluation function evaluates a difference between a unified target temperature vector of the unified characteristics equation and a predicted temperature vector obtained by the unified input response characteristics matrix and the unified zero response characteristics vector.

6. The method of claim 1, wherein the prediction model comprises coefficients related to predicting the predicted temperature of at least one of the heater temperature and the furnace temperature, a coefficient error correlation matrix, the reference temperature and a steady state power value.

7. The method of claim 6, wherein the coefficients, the coefficient error correlation matrix, the reference temperature and the steady state power value are defined respectively for the heater temperature of each zone of the heater divided into a plurality of zones and the furnace temperature of each zone of the heater.

8. The method of claim 6, wherein the prediction model of the heater temperature in every zone of the heater divided into a plurality of zones is paired with the prediction model of the furnace temperature in every zone of the heater in a manner corresponding to each of temperature ranges.

9. The method of claim 1, further comprising:
calculating a deviation between the furnace temperature and a target temperature set for each future time;
integrating the deviation acquired by a subtraction part; and
acquiring the prediction model, current and past data of the furnace temperature and current and past data of the power supply value, and calculating a prediction error for each zone of the heater,
wherein the (c) further comprises:
creating a unified characteristics equation serving as the predetermined equation using an individual input response characteristics matrix calculated for each zone of the heater, an individual zero response characteristics vector calculated for each zone of the heater, the target temperature column vector for each zone of the heater, an integral value of the deviation acquired by an integration part, and the prediction error.

10. The method of claim 1, further comprising:
storing data related to the heater temperature for a certain period; and
acquiring the prediction model of the heater temperature for each zone of the heater divided into a plurality of zones, current and past data of the heater temperature and current and past data of the power supply value, and calculating an individual input response characteristics matrix and an individual zero response characteristics vector,
wherein the (c) further comprises:
creating a unified characteristics equation serving as the predetermined equation using the individual input response characteristics matrix calculated for each zone of the heater, the individual zero response characteristics vector calculated for each zone of the heater and a target temperature column vector for each zone of the heater.

11. The method of claim 10, wherein (d) further comprises:
inputting the unified characteristics equation and upper and lower limits of the power supply value of each zone of the heater, and calculating the power supply value of current time by obtaining a solution of minimizing an evaluation function under a predetermined constraint condition using an effective constraint method,
wherein the evaluation function is obtained by a sum of square of an error between a predicted temperature vector of the furnace temperature and a unified target temperature vector of the furnace temperature and by reflecting a weight Z to a sum of square of an error between a predicted temperature vector of the heater temperature and a unified target temperature vector of the heater temperature.

12. A method of manufacturing a semiconductor device, comprising:
(a) acquiring temperature data of at least one of a heater temperature defined by a temperature of a heater and a furnace temperature defined by an inner temperature of a process chamber, and acquiring a power supply value indicating an electric power supplied to the heater;
(b) acquiring a reference temperature of the temperature data;
(c) creating a predetermined equation using a prediction model of estimating a predicted temperature of the temperature data;
(d) calculating a solution of minimizing a deviation between the reference temperature and the predicted temperature based on the predetermined equation; and
(e) outputting a calculated power supply value calculated from the solution, and processing a substrate while controlling heating of the heater based on the calculated power supply value,
wherein (d) comprises:
inputting a unified characteristics equation serving as the predetermined equation and upper and lower limits of the power supply value of each zone of the heater divided into a plurality of zones, and calculating the power supply value of current time by obtaining a solution of minimizing a value of an evaluation function under a predetermined constraint condition using an effective constraint method,
wherein the evaluation function for a reference zone is obtained by reflecting 1 as a weight Z to a sum of square of an error between a predicted temperature vector of the reference zone and a unified target temperature vector of the reference zone, and the evaluation function for a zone other than the reference zone is obtained by reflecting the weight Z to a sum of square of an error between the predicted temperature vector of the reference zone and a predicted temperature vector of the zone other than the reference zone.

13. A method of manufacturing a semiconductor device, comprising:
(a) acquiring temperature data of at least one of a heater temperature defined by a temperature of a heater and a furnace temperature defined by an inner temperature of a process chamber, and acquiring a power supply value indicating an electric power supplied to the heater;
(b) acquiring a reference temperature of the temperature data;
(c) creating a predetermined equation using a prediction model of estimating a predicted temperature of the temperature data;
(d) calculating a solution of minimizing a deviation between the reference temperature and the predicted temperature based on the predetermined equation; and
(e) outputting a calculated power supply value calculated from the solution, and processing a substrate while controlling heating of the heater based on the calculated power supply value;
(f) writing the furnace temperature and one of the heater temperature and an average of heater temperatures for a predetermined time period into a prediction model memory area as the reference temperature when the furnace temperature reaches a steady state;
(g) writing one of the power supply value and an average of power supply values for a predetermined time period into the prediction model memory area as a steady state power value when the furnace temperature reaches the steady state;
(h) acquiring current and past data of the furnace temperature and current and past data of the heater temperature from a temperature history memory area;
(i) acquiring current and past data of the power supply value from a power supply value history memory area; and (j) creating the prediction model by using data stored in the prediction model memory area, the acquired current and past data of the power supply value and at least one of the acquired current and past data of the furnace temperature and the acquired current and past data of the heater temperature.

14. The method of claim 13, further comprising:
acquiring the power supply value and at least one of the heater temperature and the furnace temperature according to predetermined temperature ranges, and creating the prediction model by using the power supply value and at least one of the heater temperature and the furnace temperature are acquired according to the predetermined temperature ranges.

15. The method of claim 13, wherein the reference temperature and the steady state power value are acquired at a temperature close to a predetermined processing temperature.

* * * * *